United States Patent
Nakazawa et al.

(10) Patent No.: US 6,885,061 B2
(45) Date of Patent: Apr. 26, 2005

(54) SEMICONDUCTOR DEVICE AND A METHOD OF MANUFACTURING THE SAME

(75) Inventors: Yoshito Nakazawa, Isesaki (JP); Yuji Yatsuda, Kumagaya (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/827,295

(22) Filed: Apr. 20, 2004

(65) Prior Publication Data

US 2004/0262678 A1 Dec. 30, 2004

(30) Foreign Application Priority Data

Jun. 26, 2003 (JP) ........................................ 2003-183153

(51) Int. Cl.[7] .............................................. H01L 29/76
(52) U.S. Cl. ...................... 257/330; 257/331; 257/340; 257/401; 438/270
(58) Field of Search ............................... 257/330, 331, 257/341, 401; 438/212, 270

(56) References Cited

U.S. PATENT DOCUMENTS 5,430,324 A  7/1995  Bencuya
5,578,851 A  11/1996  Hshieh et al.

FOREIGN PATENT DOCUMENTS

| JP | 6-151867 | 11/1992 |
| JP | 10-56174 | 8/1996 |
| JP | 10-173175 | 12/1996 |
| JP | 2001-168329 | 12/1999 |
| JP | 2002-231944 | 1/2001 |
| JP | 2002-353452 | 5/2001 |

*Primary Examiner*—Sara Crane
(74) *Attorney, Agent, or Firm*—Reed Smith LLP; Stanley P. Fisher, Esq.; Juan Carlos A. Marquez, Esq.

(57) ABSTRACT

Heightening of breakdown voltage of a trench gate type power MISFET is actualized without increasing the number of manufacturing steps. In the manufacturing method of the semiconductor device according to the present invention, p⁻ type semiconductor region and p⁻ type field limiting rings are formed in a gate line area simultaneously in one impurity ion implantation step so as to bring them into contact with a groove having a gate extraction electrode formed therein. Upon formation, supposing that the width of the gate extraction electrode disposed outside the groove is CHSP, and the resistivity of the n⁻ type single crystal silicon layer 1B is $\rho$ ($\Omega \cdot cm$), the CHSP is set to satisfy the following equation: $CHSP \leq 3.80 + 0.148\,\rho$.

20 Claims, 18 Drawing Sheets

SEMICONDUCTOR DEVICE AND A METHOD OF MANUFACTURING THE SAME

CROSS-REFERENCE TO RELATED APPLICATION

The present application claims priority from Japanese Patent application JP 2003-183153 filed on Jun. 26, 2003, the content of which is hereby incorporated by reference into this application.

BACKGROUND OF THE INVENTION

The present invention relates to a semiconductor device and a manufacturing technique thereof, particularly to a technique effective when applied to a semiconductor device having a power MISFET (Metal Insulator Semiconductor Field Effect Transistor).

In a vertical MOS transistor with a trench structure, which has a p type conductivity well diffusion layer and an n type conductivity source diffusion layer stacked in the network form over the surface of an n type conductivity semiconductor substrate, and a gate buried in an insulating film of a trench between these diffusion layers, there is disclosed, for example, a technique of heightening the breakdown voltage of the vertical MOS transistor by disposing a deep p type diffusion layer at the lower center of the source diffusion layer to cover the trench with a depletion layer upon application of a voltage between the drain and source, and disposing a p type guard ring at the periphery of the chip to promote extension of the depletion layer in the vicinity of the chip surface (refer to Patent Document 1, for example).

Also disclosed is the structure of a trench gate type MOS transistor in Japanese Patent Application Laid-Open No. 2001-168329, 2002-353452, Hei 10(1998)-173175, Hei 8(1996)-204194, Hei 6(1994)-204483, Hei 10(1998)-56174 and 2002-231944 (refer to Patent Documents 2, 3, 4, 5, 6, 7 and 8).

Patent Document 1: Japanese Patent Application Laid-Open No. Hei 6(1994)-151867

Patent Document 2: Japanese Patent Application Laid-Open No. 2001-168329

Patent Document 3: Japanese Patent Application Laid-Open No. 2002-353452

Patent Document 4: Japanese Patent Application Laid-Open No. Hei 10(1998)-173175

Patent Document 5: Japanese Patent Application Laid-Open No. Hei 8(1996)-204194

Patent Document 6: Japanese Patent Application Laid-Open No. Hei 6(1994)-204483

Patent Document 7: Japanese Patent Application Laid-Open No. Hei 10(1998)-56174

Patent Document 8: Japanese Patent Application Laid-Open No. 2002-231944

SUMMARY OF THE INVENTION

Transistors which can handle electricity of several watts or greater and suited for high electricity use are called power transistors and a variety of structures are under investigation. Among them, power MISFETs have structures called vertical type and horizontal type. They can also be classified into a trench gate type or planar gate type, depending on the structure of its gate portion. In such power MISFETs, plural (tens of thousands, for example) finely patterned MISFETs are connected in parallel to produce a great amount of electricity.

The present inventors are investigating the techniques enabling maintenance of sufficient breakdown voltage in such a power MISFET. One example of them will be described below.

Described specifically, in a trench gate power MISFET, a semiconductor layer (which will hereinafter be called "channel layer") serving as a channel of the power MISFET is formed over the main surface of a semiconductor substrate (which will hereinafter be called "substrate", simply). A semiconductor layer (which will hereinafter be called "well layer") having a depth greater than that of the channel layer is formed and with this well layer, a groove having a gate extraction portion formed therein, among the gate portions, is covered. In this gate extraction portion, without this well layer thereover, an increase in the electric field occurs in a region around the bottom of this groove and an avalanche current flows concentratedly on this region, presumably lowering the breakdown voltage at the gate extraction portion. By the formation of the well layer, a lowering in the breakdown voltage at the gate extraction portion is thus prevented. No such consideration is included in the technique disclosed in the above-described Patent Document 1. Moreover, in the technique under investigation by the present inventors, a well layer is formed also in a termination region encompassing the periphery of the semiconductor chip (which will hereinafter be called "chip", simply) and, it is allowed to function as a field limiting ring (FLR). A high breakdown voltage of the power MISFET is thus accomplished by forming such a well layer including a field limiting ring.

Two semiconductor layers are however necessary for the formation of the channel layer and well layer, and in order to heighten the breakdown voltage of the power MISFET, an increase in the number of manufacturing steps is inevitable. This leads to another problem, that is, extension of time for completion of the semiconductor device having a power MISFET.

An object of the present invention is to provide a technique capable of heightening breakdown voltage of a power MISFET without increasing the number of manufacturing steps.

The above-described and the other objects and novel features of the present invention will be apparent by the description herein and accompanying drawings.

Of the inventions disclosed by the present application, typical ones will next be outlined briefly.

In one aspect of the present invention, there is thus provided a semiconductor device comprising:

(a) a semiconductor substrate having a main surface and a back surface, including a first region, a second region and a third region, and having a first semiconductor layer of a first conductivity type formed over the main surface;

(b) a second semiconductor layer formed over the first semiconductor layer in the first region and having a second conductivity type opposite to the first conductivity type;

(c) a plurality of first groove portions penetrating, in the first region, through the second semiconductor layer from the main surface of the semiconductor substrate;

(d) a first insulating film formed in the first groove portions;

(e) a first conductor formed over the first insulating film;

(f) a third semiconductor layer formed, in the second semiconductor layer, adjacent to the first groove portion and having the first conductivity type;

(g) a second groove portion formed in the second region;

(h) a second insulating film formed in the second groove portion;

(i) a second conductor formed over the second insulating film and electrically connected to the first conductor; and (j) a plurality of fourth semiconductor layers formed over the first semiconductor layer in the third region and having the second conductivity type, wherein the second groove portion is in contact with the second semiconductor layer and the fourth semiconductor layer, and the second semiconductor layer and the fourth semiconductor layer each has a first impurity concentration and a first depth.

In anther aspect of the present invention, there is also provided a manufacturing method of a semiconductor device having a trench gate type MISFET, a gate extraction portion of the trench gate type MISFET and a field limiting ring in a first region, a second region and a third region of a semiconductor substrate, respectively, which comprises the steps of:

(a) forming a first semiconductor layer of a first conductivity type over the main surface of the semiconductor substrate;

(b) forming a first groove portion and a second groove portion in the first region and the second region, respectively, over the main surface of the semiconductor substrate;

(c) forming an insulating film in the first groove portion and the second groove portion;

(d) forming a conductor over the insulating film;

(e) after the step (d), implanting an impurity of a second conductivity type opposite to the first conductivity type into the semiconductor substrate in the first region to form a second semiconductor layer of the second conductivity type over the first semiconductor layer in the first region and implanting an impurity of the second conductivity type opposite to the first conductivity type into the semiconductor substrate in the third region to form a fourth semiconductor layer of the second conductivity type over the first semiconductor layer in the third region; and (f) implanting an impurity of the first conductivity type into the second semiconductor layer to form therein a third semiconductor layer of the first conductivity type adjacent to the first groove portion, wherein the second semiconductor layer is formed so that the first groove portion penetrates through the second semiconductor layer, wherein in the first region, the trench gate type MISFET having the first semiconductor layer as a drain, the second semiconductor layer as a channel, the third conductor layer as a source and the conductor in the first region as a gate, and wherein the field limiting ring is formed to two-dimensionally encompass the first region and the second region from the fourth semiconductor layer.

DETAILED DESCRIPTION OF THE PREFERRED EMBODIMENTS

Figure 1:
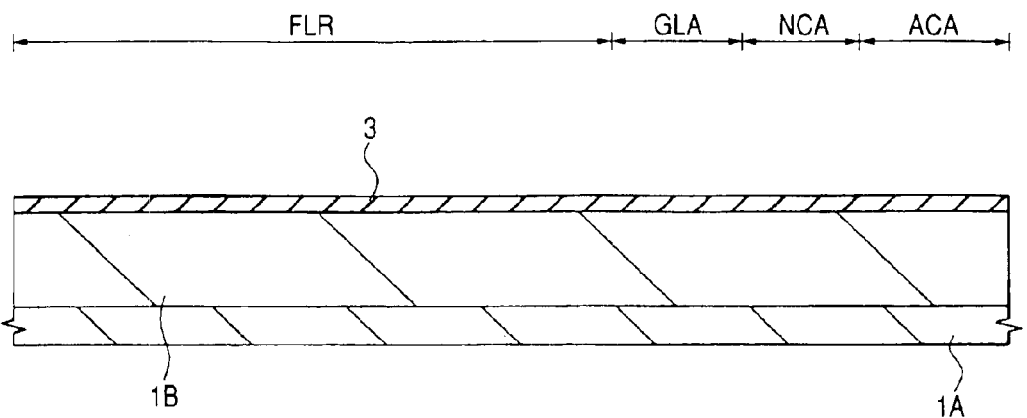
FIG. 1 is a fragmentary cross-sectional view for explaining the manufacturing method of the semiconductor device according to Embodiment 1 of the present invention.

The embodiments of the present invention will hereinafter be described specifically based on accompanying drawings. In all the drawings for describing the below-described embodiments, members having like function will be identified by like reference numerals and overlapping descriptions will be omitted. In the diagrams used for explaining the embodiments, hatching is added even in a plan view in order to facilitate the understanding of the positional relationship among members.

(Embodiment 1)

The semiconductor device according to Embodiment 1 has, for example, an n-channel trench-gate type power MISFET. Referring to FIGS. 1 to 12, a manufacturing method of the semiconductor device according to Embodiment 1 will next be described in the order of steps.

As illustrated in FIG. 1, prepared is a semiconductor substrate (which will hereinafter be called "substrate" simply) in which an n⁻ type single crystal silicon layer (first semiconductor layer) 1B doped with an impurity (for example, phosphorus) of an n type conductivity has been epitaxially grown over the surface (main surface) of an n⁺ type single crystal silicon substrate 1A having an n type (first conductivity type) conductivity. This substrate has an active cell region (first region) ACA in which an active cell of the power MISFET is to be formed, a nonactive cell region (first region) NCA in which a nonactive cell is to be formed, a gate line area (second region) GLA in which an interconnect electrically connected to the gate electrode of the power MISFET is to be formed and a termination region (third region) FLR in which a field lifting ring is to be formed, each to be formed in the later steps. The n⁺ type single crystal silicon substrate 1A and n⁻ type single crystal silicon layer 1B will be drain regions of the power MISFET in the later step. A silicon oxide film 3 is then formed by thermal oxidation of the surface (main surface) of the n⁻ type single crystal silicon layer 1B.

Figure 2:
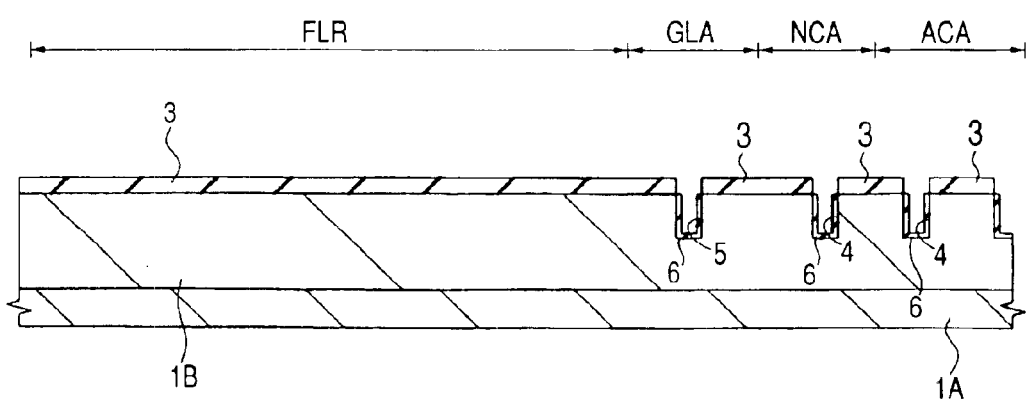
FIG. 2 is a fragmentary cross-sectional view of the semiconductor device during the manufacturing step following that of FIG. 1.

As illustrated in FIG. 2, with a photoresist film patterned by photolithography as a mask, the silicon oxide film 3 and the n⁻ type single crystal silicon layer 1B are etched to form a groove (first groove portion) 4 in the active cell region CA and nonactive cell region NCA and a groove (second groove portion) in the gate line area GLA. The substrate is then subjected to thermal oxidation treatment to form a silicon oxide film (first insulating film, a second insulating film) 6 over the side walls and bottom of the grooves 4 and 5. The silicon oxide film 6 will be a gate insulating film of the power MISFET.

Figure 3:
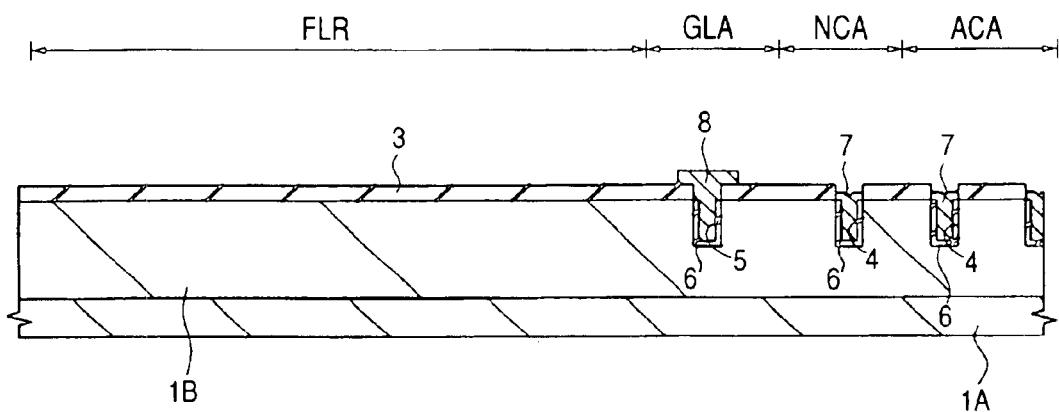
FIG. 3 is a fragmentary cross-sectional view of the semiconductor device during the manufacturing step following that of FIG. 2.

As illustrated in FIG. 3, a polycrystalline silicon film having, for example, P (phosphorus) doped therein is deposited over the silicon oxide film 3 including the insides of the grooves 4 and 5 to fill the grooves 4 and 5 with the polycrystalline silicon film. Then, with a photoresist film patterned by photolithography as a mask, the polycrystalline silicon film is etched to leave it inside of the grooves 4 and 5, whereby a gate electrode (first conductor) 7 of the power MISFET is formed in the groove 4 and a gate extraction electrode (second conductor, gate extraction portion) 8 is formed in the groove 5. Upon this formation, patterning is conducted so that a portion of the polycrystalline silicon film which forms the gate extraction electrode 8 remains outside the groove 5. By this patterning, the gate extraction electrode 8 extends in a direction (first direction) vertical to the paper in FIG. 3 and the width (second width) of a portion (first portion) outside the groove 5 is greater than the width (first width) of a portion (second portion) in the groove 5.

Figure 4:
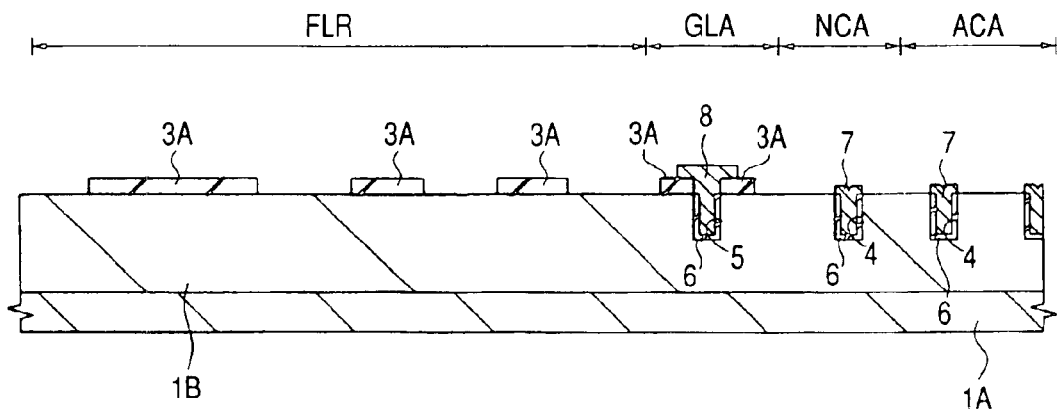
FIG. 4 is a fragmentary cross-sectional view of the semiconductor device during the manufacturing step following that of FIG. 3.

As illustrated in FIG. 4, with a photoresist film patterned by photolithography as a mask, the silicon oxide film 3 is etched to remove an unnecessary portion of the silicon oxide film 3. From the remaining silicon oxide film 3, a field insulating film (third insulating film) 3A is formed. Upon this formation, in the gate line area GLA, with the portion (first portion) of the gate extraction electrode 8 outside the groove 5 as a mask, the silicon oxide film 3 may be etched in self alignment with the portion of the gate extraction electrode 8 outside the groove 5.

Figure 5:
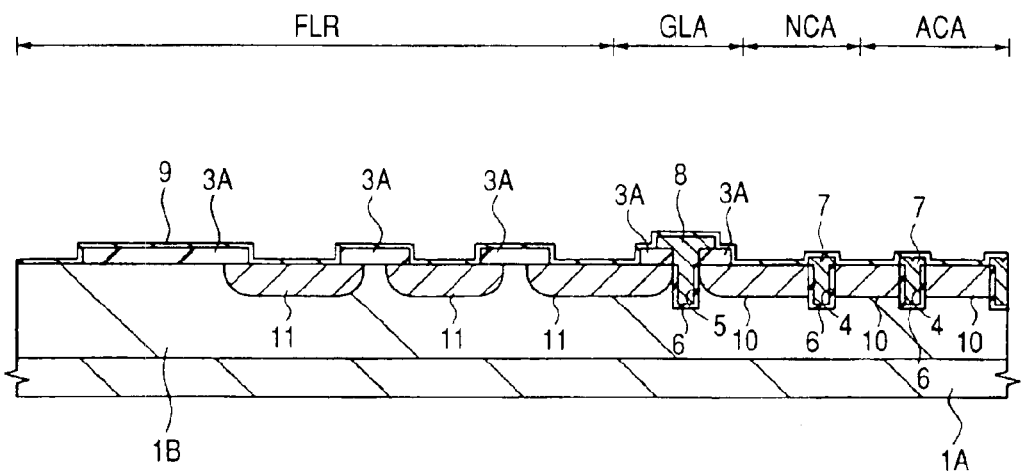
FIG. 5 is a fragmentary cross-sectional view of the semiconductor device during the manufacturing step following that of FIG. 4.

As illustrated in FIG. 5, a silicon oxide film 9 is deposited over the surface of the n⁻ type single crystal silicon layer 1B. With a photoresist film patterned by photolithography as a mask, an impurity ion (B (boron), for example) having a p type conductivity (second conductivity type) is implanted into the n⁻ type single crystal silicon layer 1B at a predetermined concentration (first impurity concentration). The substrate is then heat treated to diffuse the impurity ion, whereby a p⁻ type semiconductor region (second semiconductor layer) 10 is formed in the active cell region ACA and p⁻ type field limiting ring (fourth semiconductor layer) 11 is formed in the termination region FLR. The p⁻ type semiconductor region 10 will be a channel layer for the power MISFET after the formation of the power MISFET. A plurality of the p⁻ type field limiting rings 11 are formed in the ring form, when viewed from the top, in a region encompassing the active cell region and nonactive cell region NCA. The p⁻ type semiconductor region 10 and p⁻ type field limiting rings 11 are formed so that their ends reach the side walls of the groove 5 having the gate extraction electrode 8 formed therein but their depth is shallower than the depth of the grooves 4 and 5. The field limiting ring encompasses the planar junction of each element or IC by a ring-shaped junction and relaxes an electric field at the corner of the planar junction to actualize high breakdown voltage, as described, for example, on page 938 of "Dictionary of Semiconductor Terms" ed. by Editorial Committee of Dictionary of Semiconductor Terms, published by Nikkan Kogyo Press on Mar. 20, 1999.

Figure 6:
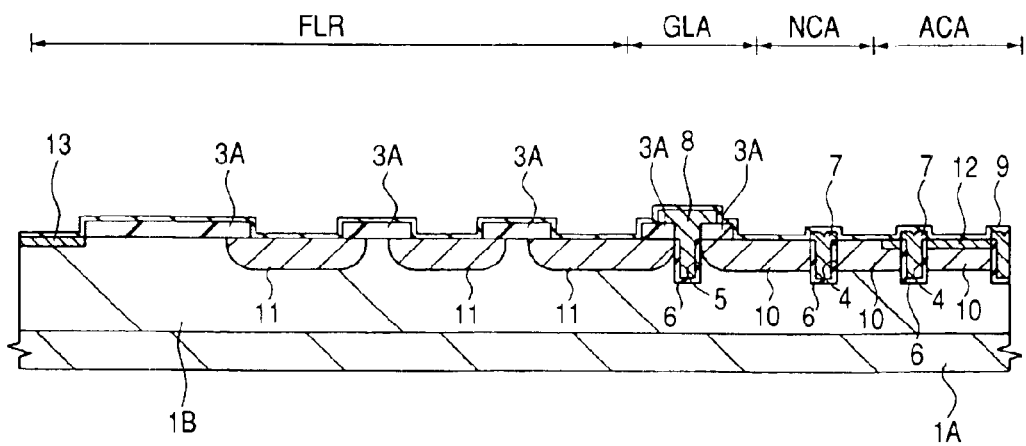
FIG. 6 is a fragmentary cross-sectional view of the semiconductor device during the manufacturing step following that of FIG. 5.

As illustrated in FIG. 6, with a photoresist mask patterned by photolithography as a mask, an impurity ion (As (arsenic), for example) having an n type conductivity is implanted into the substrate. The substrate is then heat treated to diffuse the impurity ion, whereby an n$^+$ type semiconductor region (third semiconductor layer) 12 is formed in the p$^-$ type semiconductor region 10 of the active cell region ACA and n$^+$ type guard ring region 13 is formed in the n$^-$ type single crystal silicon layer 1B in the termination region FLR. By the steps so far described, the power MISFET having the n$^+$ type single crystal silicon substrate 1A and n$^-$ type single crystal silicon layer 1B as drain regions and the n$^+$ type semiconductor region 12 as a source region can be formed. When the substrate is divided into each semiconductor chip (which will hereinafter be called "chip", simply), the n$^+$ type guard ring region 13 is formed to encompass the p$^-$ type field limiting ring 11 when viewed from the top and has a function of protecting the power MISFET device.

Figure 7:
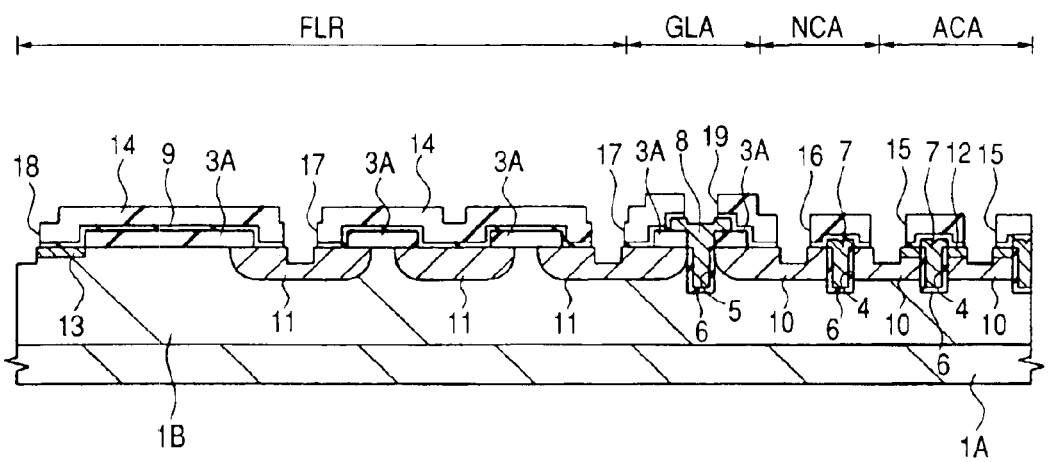
FIG. 7 is a fragmentary cross-sectional view of the semiconductor device during the manufacturing step following that of FIG. 6.

As illustrated in FIG. 7, after deposition of a PSG (Phospho Silicate Glass) film over the substrate, an SOG (Spin On Glass) film is applied to the PSG film to form an insulating film 14 made of the PSG and SOG films. With a photoresist film patterned by photolithography as a mask, the insulating film 14 and n$^-$ type single crystal silicon layer 1B are etched to form contact grooves 15, 16, 17, 18 and 19. The contact groove 15 is formed between the two adjacent gate electrodes 7 in the active cell region ACA and is brought into contact with the n$^+$ type semiconductor region 12 which is to be a source region of the power MISFET. The contact groove 16 is formed between the gate electrode 7 and gate extraction electrode 8 which are adjacent each other in the nonactive cell region NCA and is brought into contact with the p$^-$ type semiconductor region 10. The contact groove 17 is formed in the termination region FLR and is brought into contact with the p$^-$ type field limiting ring 11. The contact groove 18 is formed in the termination region FLR and is brought into contact with the n$^+$ type guard ring region 13. The contact groove 19 is formed in the gate line area GLA and reaches the gate extraction electrode 8.

Figure 8:
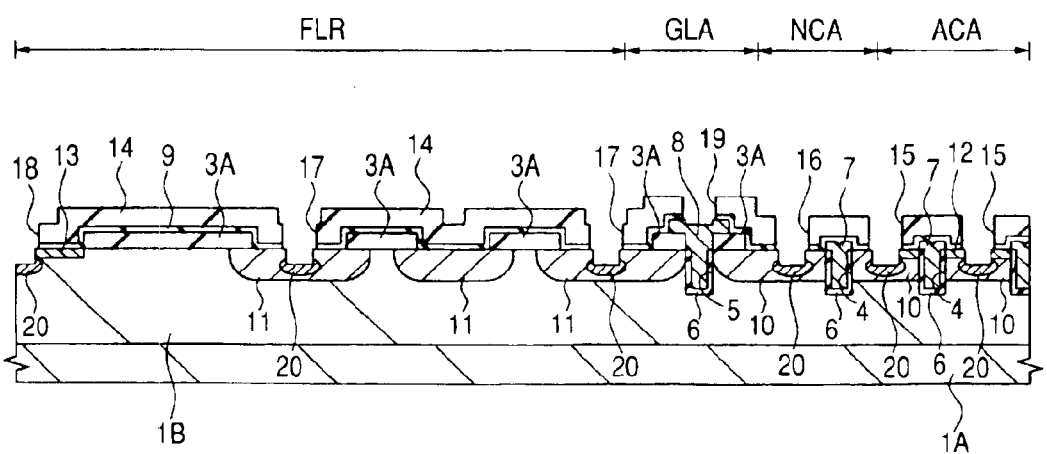
FIG. 8 is a fragmentary cross-sectional view of the semiconductor device during the manufacturing step following that of FIG. 7.

As illustrated in FIG. 8, an impurity ion having a p type conductivity, for example, $BF_2$ (boron difluoride) is implanted into the bottom of each of the contact grooves 15, 16, 17 and 18. The substrate is then heat treated to diffuse the impurity ion, whereby a p$^+$ type semiconductor region 20 is formed. By forming the contact grooves 15, 16, 17 and 18 and disposing the p$^+$ type semiconductor region 20 on the bottoms thereof in such a manner, a margin for mask alignment can be reduced, making it possible to attain miniaturization of the space between any two adjacent gate electrodes 7. This p$^+$ type semiconductor region 20 is formed to make an ohmic contact of an interconnect to be formed in the later step with the p$^-$ type semiconductor region 10 or p$^-$ type field limiting ring 11 at the bottom of the contact groove 15, 16, 17 or 18.

Figure 9:
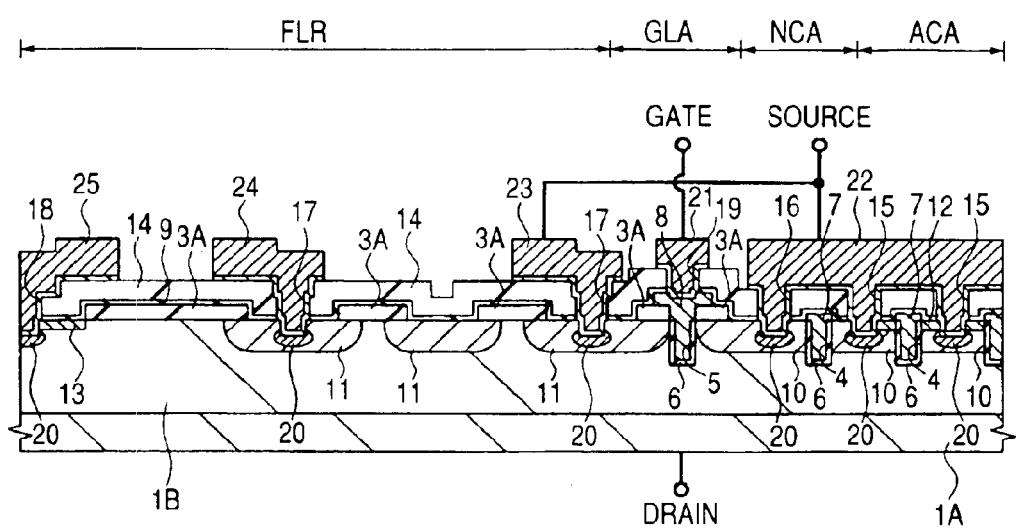
FIG. 9 is a fragmentary cross-sectional view of the semiconductor device during the manufacturing step following that of FIG. 8.

As illustrated in FIG. 9, a thin TiW (titanium-tungsten) film is deposited as a barrier conductor film over the insulating film 14 including the insides of the contact grooves 15, 16, 17, 18 and 19, followed by heat treatment of the substrate. Over the TiW film, an Al (aluminum) film is deposited, for example, by sputtering. The barrier conductor film serves to prevent the formation of an undesired reaction layer which will otherwise be formed by the contact between Al and substrate (Si). In this Embodiment 1, an Al film means a film composed mainly of aluminum and it may contain another metal.

With a photoresist film patterned by photolithography as a mask, the TiW film and Al film are etched to form a gate line 21 electrically connected to the gate extraction electrode 8, a source pad (source electrode) 22 electrically connected to the n$^+$ type semiconductor region 12 which is to be a source region of the power MISFET, an interconnect 23 electrically connected to one of the p$^-$ type field limiting rings 11 and also to the source pad 22 in a region not illustrated in FIG. 9, an interconnect (third conductor) 24 electrically connected to a p$^-$ type field limiting ring 11 which is different from the p$^-$ type field limiting ring 11 to which the interconnect 23 is electrically connected, an interconnect 25 electrically connected to the n$^+$ type guard ring region 13, and a gate pad (gate electrode) electrically connected to the gate line 21. The gate pad is formed in a region not illustrated in FIG. 9.

Figure 10:
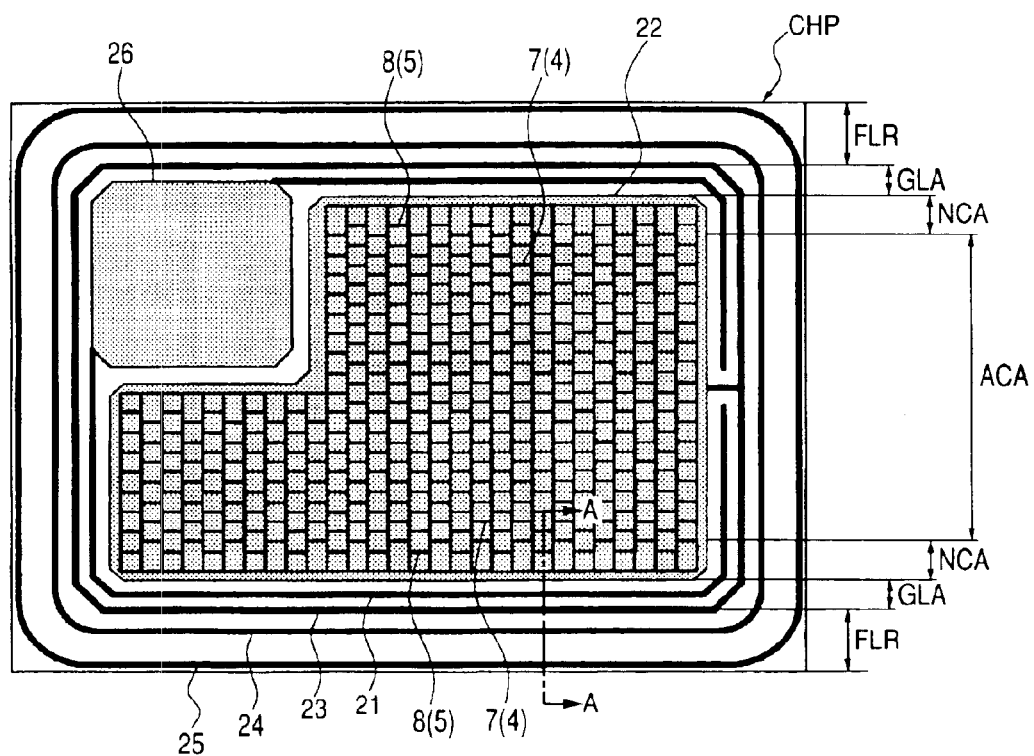
FIG. 10 is a fragmentary plan view of the semiconductor device according to Embodiment 1 of the present invention during the manufacturing step.
Figure 11:
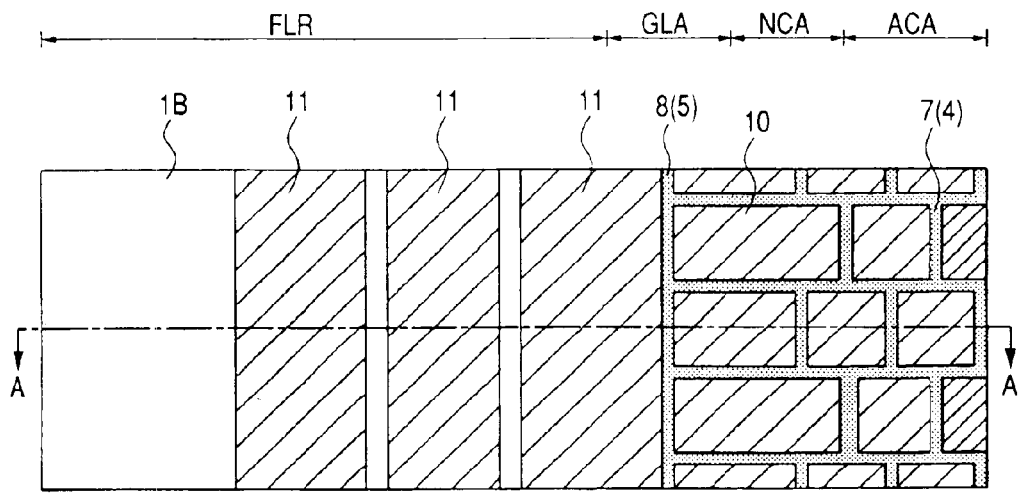
FIG. 11 is an enlarged fragmentary plan view of the vicinity of line A—A of FIG. 10.
Figure 12:
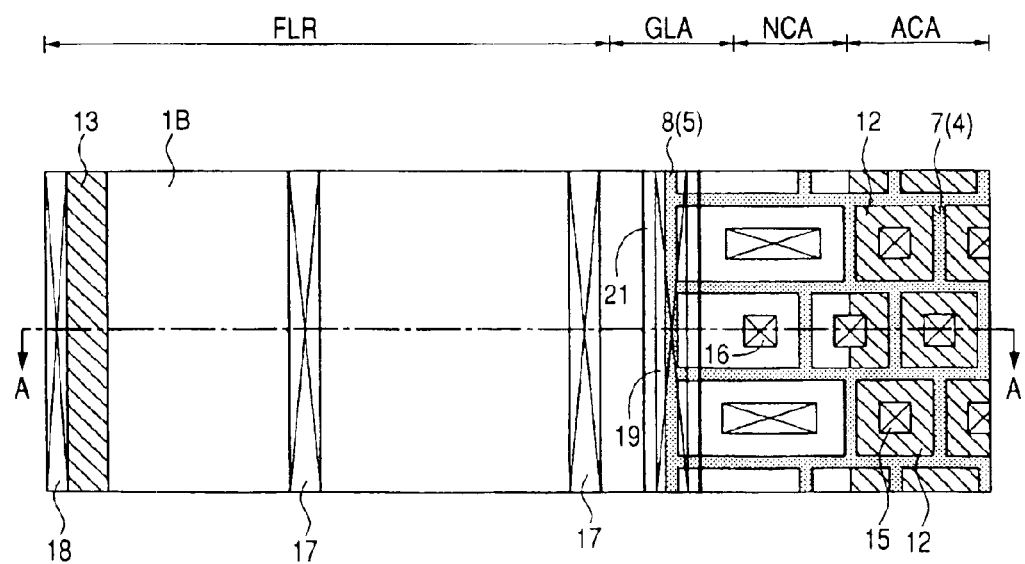
FIG. 12 is another enlarged fragmentary plan view of the vicinity of line A—A of FIG. 10.

The plan view of the substrate over which the gate line 21, source pad 22, interconnects 23, 24 and 25, and gate pad have been formed is illustrated in FIGS. 10 to 12. FIG. 10 illustrates a chip region CHP corresponding to one chip when the substrate is divided into each chip in the later step. FIGS. 11 and 12 are enlarged views of the vicinity of a line A—A illustrated in FIG. 10. FIG. 11 and FIG. 12 are plan views of the same region, but to facilitate understanding of the positional relationship of members, some members are illustrated in both and some are illustrated in one of them. The cross-section shown in FIGS. 1 to 9 is taken along the line A—A.

As illustrated in FIGS. 10 to 12, in the chip region CHP (plane), active cell region ACA, nonactive cell region NCA, gate line area GLA and termination region FLR are formed so that the nonactive cell region NCA encompasses the active cell region ACA, the gate line area GLA encompasses the nonactive cell region NCA and the termination region FLR encompasses the gate line area GLA. As described above, the n$^+$ type semiconductor region 12 (refer to FIG. 6, for example) which will be the source of the power MISFET of Embodiment 1 is formed in the active cell region ACA but not formed in the nonactive cell region NCA. When the n$^+$ type semiconductor region 12 is formed in the nonactive cell region NCA, a parasitic MISFET having the n$^+$ type single crystal silicon substrate 1A (refer to FIG. 6, for example) and n$^-$ type single crystal silicon layer 1B (refer to FIG. 6, for example) as drain regions, n$^+$ type semiconductor region 12 as the source region, the gate extraction electrode 8 (refer to FIG. 6, for example) as a gate electrode and the p$^-$ type semiconductor region 10 (refer to FIG. 6, for example) as a channel is formed. Here, the gate electrode 7 (refer to FIG. 6, for example) and the gate extraction electrode 8 are formed together and electrically connected each other so that the starting of the power MISFET also starts operation of the parasitic MISFET, presumably causing inconvenience of occurrence of current concentration on a cell in the vicinity of the chip peripheral region. As in Embodiment 1, therefore, by surrounding the cell of the power MISFET formed in the active cell region ACA with the nonactive cell region NCA in which a dummy cell free of the n$^+$ type semiconductor region 12 is formed, parasitic operation, which will otherwise occur by the parasitic MISFET, can be prevented. This makes it possible to avoid inconvenience due to current concentration onto the cell in the vicinity of the peripheral region of the chip of the power MISFET.

As illustrated in FIGS. 10 to 12, the plane pattern of the gate electrode 7 (groove 4) in this Embodiment 1 is a square mesh. The source pad 22 formed over the gate electrode 7 is electrically connected to the interconnect 23. The gate pad (gate electrode 26) is formed from the same interconnect layer with the gate line 21, source pad 22 and interconnects 23, 24 and 25 and is electrically connected to the gate line 21. The interconnect 25 electrically connected to the n$^+$ type guard ring region 13 (refer to FIG. 9, for example) and the interconnects 24 and 25 electrically connected to the p⁻ type field limiting ring 11 are disposed in this order from the outermost periphery of the chip region so as to encompass the active cell region ACA.

Figure 13:
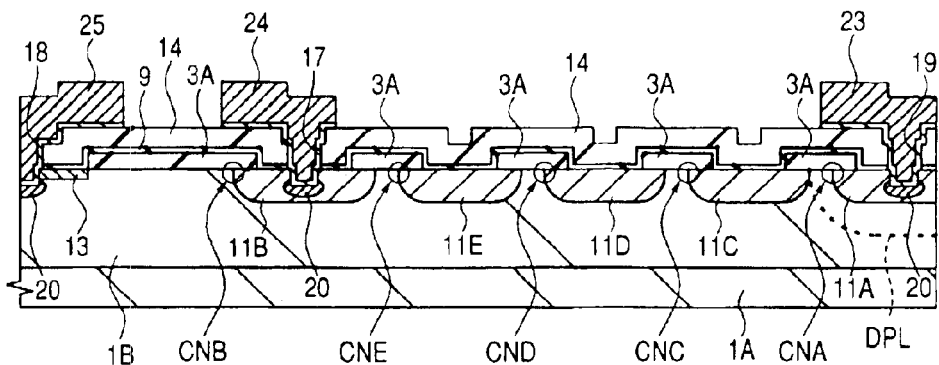
FIG. 13 is a fragmentary cross-sectional view for explaining the field limiting ring.

FIG. 13 is a fragmentary cross-sectional view illustrating the function of the p⁻ type field limiting ring 11 (refer to FIG. 9, for example). In FIG. 13, of a plurality of the p⁻ type field limiting rings 11, that electrically connected to the interconnect 23 is called a p⁻ type field limiting ring 11A, that electrically connected to the interconnect 24 is called a p⁻ type field limiting ring 11B and assuming that there are three p⁻ type field limiting rings between the p⁻ type field limiting ring 11A and p⁻ type field limiting ring 11B, these p⁻ type field limiting rings are called 11C, 11D and 11E in order of the space near from the p⁻ type field limiting ring 11A.

The p⁻ type field limiting rings 11B, 11C, 11D and 11E are in the floating state with voltage being not fixed. When a reverse bias voltage is applied between the drain and the interconnect 23 electrically connected to the source region of the power MISFET, first a depletion layer DPL is formed around the p⁻ type field limiting ring 11A. With an increase in the reverse bias voltage, the depletion layer extends toward the p⁻ type field limiting ring 11C so that the prior to avalanche breakdown of the p⁻ type field limiting ring 11A, the depletion layer DPL is caused to reach the p⁻ type field limiting ring 11B as illustrated in the dotted line in FIG. 13. In the p⁻ type field limiting ring 11A, the electric field becomes the maximum at a corner portion CNA, but by causing the depletion layer DPL to reach the p⁻ type field limiting ring 11C prior to the occurrence of avalanche breakdown at the corner portion CNA, the electric field at the corner portion CNA can be relaxed. A subsequent increase in the reverse bias voltage raises the electric field of the p⁻ type field limiting ring 11C at the corner portion CNC, but by causing a depletion layer extending from the p⁻ type field limiting ring 11C to reach the p⁻ type field limiting ring 11D prior to occurrence of breakdown at a corner portion CNC of the p⁻ type field limiting ring 11C, the electric field at the corner portion CNC can be relaxed. By a further increase in the reverse bias voltage, high electric field portions such as a corner portion CND of the p⁻ type field limiting ring 11D and then a corner portion CNE of the p⁻ type field limiting ring 11E appear one after another, but each electric field can be relaxed in a similar manner. Heightening of the breakdown voltage in the termination region FLR can be actualized, as high electric field portions thus appear successively toward the outer corners of the p⁻ type field limiting rings, leading to the existence of a plurality of high electric field portions. In the end, the corner portion CNB of the outermost p⁻ type field limiting ring 11B tends to be the highest field effect portion, but the interconnect 24 disposed to electrically connect to the p⁻ type field limiting ring 11B can be caused to function as a field plate for relaxing the electric field.

Figure 14:
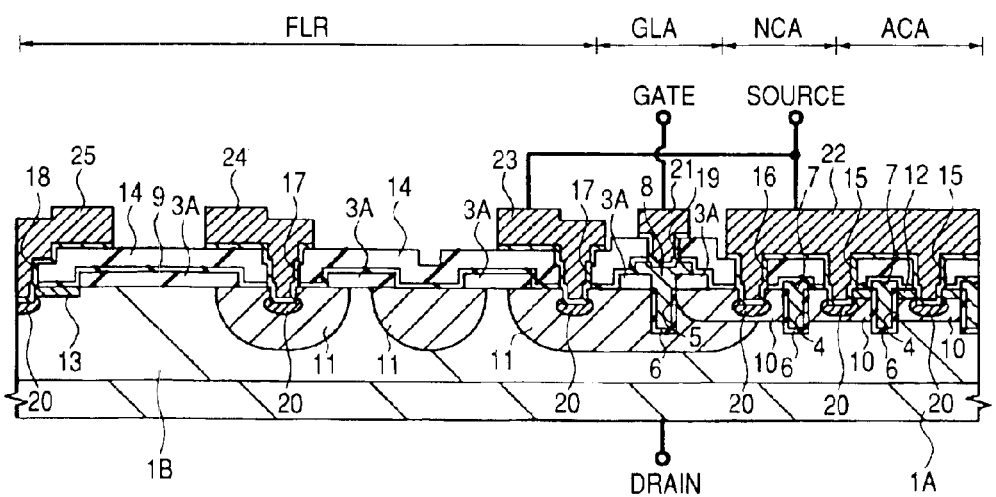
FIG. 14 is a fragmentary cross-sectional view of a substrate used for comparison with a substrate having, formed thereover, the semiconductor device of Embodiment 1 of the present invention.

FIG. 14 is a fragmentary cross-sectional view of a substrate compared by the present inventors with the substrate over which the power MISFET of this Embodiment 1 has been formed.

The substrate illustrated in FIG. 14 is almost similar to the substrate (refer to FIG. 9, for example) over which the power MISFET of this Embodiment 1 has been formed. In it, however, p⁻ type field limiting rings 11 are deeper than those in the substrate over which the power MISFET of this Embodiment 1 has been formed. One of them is formed to cover a groove 5 having a gate extraction electrode 8 formed therein. It is possible to increase the junction breakdown voltage of the p⁻ type field limiting rings 11 by deepening the p⁻ type field limiting rings 11. In the gate line area GLA, however, a p⁻ type semiconductor region 10 partially overlaps with the p⁻ type field limiting ring 11. Existence of such an overlapped portion disturbs the simultaneous formation of the p⁻ type semiconductor region 10 and p⁻ type field limiting rings 11 in the impurity ion implantation step as described referring to FIG. 5. Described specifically, two impurity ion implantation steps are necessary for the formation of the p⁻ type semiconductor region 10 and p⁻ type field limiting rings 11, which results in an increase in the number of manufacturing steps compared with the manufacturing method of the semiconductor device according to this Embodiment 1. There is a potential danger of causing extension of TAT (Turn Around Time) of the semiconductor device manufacture. In addition, an increase in the number of the manufacturing steps may presumably lead to a rise in the manufacturing cost of the semiconductor device.

Figure 15:
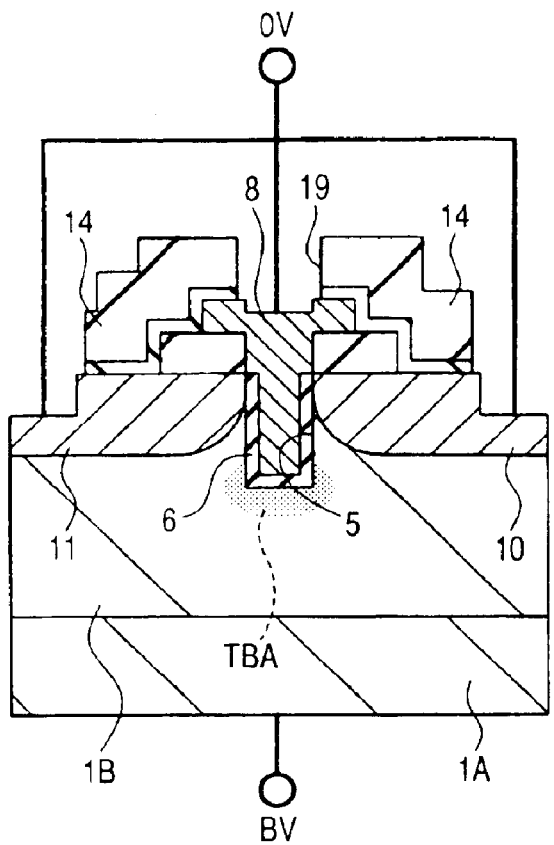
FIG. 15 is a fragmentary cross-sectional view for explaining the electric field concentration in the structure which the semiconductor device according to Embodiment 1 of the present invention has.

When the p⁻ type field limiting rings 11 are shallow as in Embodiment 1, the breakdown voltage of the termination region FLR can be heightened to the same level with that of the active cell region ACA and nonactive cell region NCA by increasing the number of the p⁻ type field limiting rings 11 or optimizing the space between the two adjacent p⁻ type field limiting rings 11. When the p⁻ type semiconductor region 10 and p⁻ type field limiting rings 11 are formed in one step, the p⁻ type field limiting rings 11 do not cover the groove 5, leading to a rise in the electric field between the gate and drain. In other words, the breakdown voltage in the gate line area GLA is lower than that of each of the active cell region ACA, nonactive cell region NCA and termination region FLR. As illustrated in FIG. 15, when the breakdown of the power MISFET occurs at a breakdown voltage BV, the electric field in a groove bottom region TBA increases and the breakdown voltage lowers in turn, causing concentrated flow of an avalanche current in this region TBA. A local breakdown occurs if a place with lower breakdown voltage exists so that there is a potential danger of lowering in the avalanche resistance of the power MISFET according to Embodiment 1. In addition, there is a potential danger of a decline in the reliability owing to injection of electrons and holes generated by the electron-impact ionization into the gate insulating film.

In this Embodiment 1, therefore, inconveniences as described above are prevented by introducing the following setting for the formation of the p⁻ type semiconductor region 10 and p⁻ type field limiting rings 11.

Figure 16:
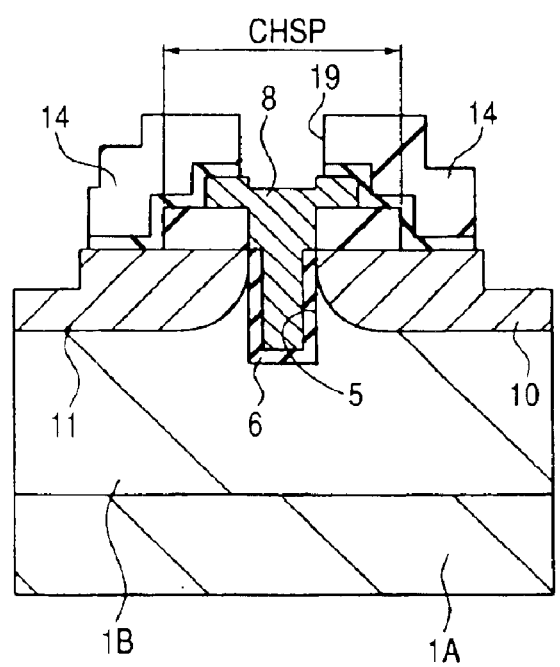
FIG. 16 is a fragmentary cross-sectional view of the semiconductor device according to Embodiment 1 of the present invention during its manufacturing step.

Described specifically, as illustrated in FIG. 16, in the gate line area GLA, a portion of the gate extraction electrode 8 disposed outside of the groove 5 and the field insulating film 3A serve as a mask upon impurity ion implantation for the formation of the p⁻ type semiconductor region 10 and p⁻ type field limiting rings 11. The impurity ion is therefore implanted with this space apart. When this space is designated as an ion implantation space CHSP, an improvement in the breakdown voltage in the gate line area GLA can be accomplished by narrowing this space CHSP as much as possible. By narrowing the space CHSP, when a reverse bias voltage is applied between the drain and each of the source pad 22 and interconnect 23, depletion layers extending from the p⁻ type semiconductor region 10 and the p⁻ type field limiting ring 11 toward the n⁻ type single crystal silicon layer 1B connect each other and the region TBA in the vicinity of the bottom of the groove 5 (refer to FIG. 15) can be covered with it. This relaxes the electric field in the region TBA. When the ion implantation space CHSP is set to an excessively narrow value, on the other hand, the pattern of the gate extraction electrode 8 is miniaturized, making it difficult to form a contact groove 19 in an insulating film 14 over the gate extraction electrode 8. When the ion implantation space CHSP is set to an excessively wide value, on the contrary, the region TBA cannot be covered with the depletion layer extending from the p⁻ type semiconductor region 10 toward the n⁻ type single crystal silicon layer 1B and the electric field in the region TBA cannot be relaxed, leading to lowering in the breakdown voltage in the gate line area GLA.

Figure 17:
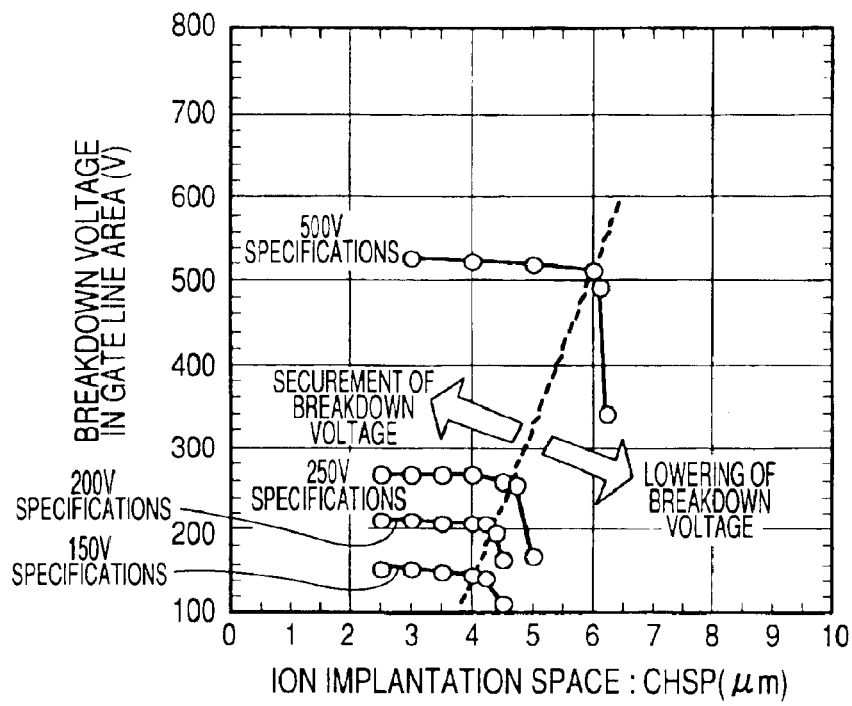
FIG. 17 is a schematic view illustrating the simulation results of the breakdown voltage in the gate line area of the power MISFET which the semiconductor device according to Embodiment 1 of the present invention has.
Figure 18:
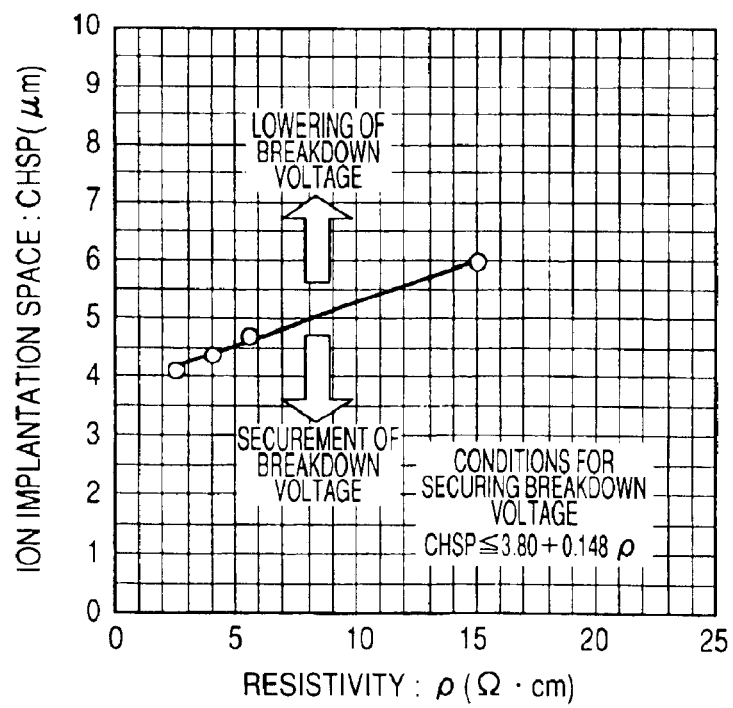
FIG. 18 is a schematic view illustrating a range of the space for ion implantation permitting maintenance of the breakdown voltage of the power MISFET which the semiconductor device according to Embodiment 1 of the present invention has.

The present inventors have investigated a method of setting an appropriate range for the ion implantation space CHSP by simulation. FIG. 17 shows simulation results of variations in the breakdown voltage in the gate line area GLA when the ion implantation space CHSP is changed by using, as models, power MISFETs having a breakdown voltage ranging from about 150V to 500V between source and drain. FIG. 18 shows, based on the data of FIG. 17, a range of the ion implantation space CHSP within which the breakdown voltage of the power MISFET can be maintained. The simulation of the power MISFET of 150V specification was conducted while setting the resistivity and thickness of the n⁻ type single crystal silicon layer 1B at 2.5 $\Omega\cdot$cm and 14 $\mu$m, respectively and the formation depth of the p⁻ type semiconductor region 10 at 1.69 $\mu$m; the simulation of the power MISFET of 200V specification was conducted while setting the resistivity and thickness of the n⁻ type single crystal silicon layer 1B at 4 $\Omega\cdot$cm and 18 $\mu$m, respectively and the formation depth of the p⁻ type semiconductor region 10 at 1.75 $\mu$m; the simulation of the power MISFET of 250V specification was conducted while setting the resistivity and thickness of the n⁻ type single crystal silicon layer 1B at 5.5 $\Omega\cdot$cm and 20 $\mu$m, respectively and the formation depth of the p⁻ type semiconductor region 10 at 1.82 $\mu$m; and the simulation of the power MISFET of 500V specification was conducted while setting the resistivity and thickness of the n⁻ type single crystal silicon layer 1B at 15 $\Omega\cdot$cm and 40 $\mu$m, respectively and the formation depth of the p⁻ type semiconductor region 10 at 1.98 $\mu$m. As a result, it has been found, as illustrated in FIG. 17, that when the ion implantation space CHSP exceeds a predetermined value, the electric field between the gate and drain rises and the breakdown voltage drops drastically. As illustrated in FIG. 18, it has been found that the ion implantation space CHSP at which the breakdown voltage shows a drastic drop can be represented by the resistivity $\rho$ ($\Omega\cdot$cm) of the n⁻ type single crystal silicon layer 1B. These results suggest that a range of the ion implantation space CHSP within which the breakdown voltage in the gate line area GLA can be maintained can be represented by the following equation: CHSP$\leq$3.80+0.148 $\rho$. In short, in the power MISFET according to this Embodiment 1, it is possible to maintain a desired breakdown voltage even in the gate line area GLA by setting, within the above-described range of the ion implantation space CHSP, an ion implantation space CHSP to permit the formation of the contact groove 19 in the insulating film 14.

In the power MISFET of this Embodiment 1, the breakdown voltage can be heightened as the formation depth of the p⁻ type semiconductor region 10 is made greater. In the active cell region ACA which is operated as the MISFET, a groove 4 deeper than the p⁻ type semiconductor region 10 is necessary for forming the MISFET. With an increase in the depth of the groove 4, it becomes difficult to miniaturize the planar size of the groove 4. In addition, as the groove 4 becomes deeper, there is a potential danger of an increase in the capacitance between gate and source (input capacitance).

In order to increase the depth of the groove 4 over that the p⁻ type semiconductor region 10 without failure, the depth of the groove 4 must be determined with a margin in consideration of a difference from the depth formed in practice. Addition of this margin, however, increases a contact region between the silicon oxide film 6 formed in the groove 4 and the n⁻ type single crystal silicon layer 1B, which presumably increases the capacitance between gate and drain. Such an increase in parasitic capacity, for example, capacitance between gate and source or capacitance between gate and drain may presumably cause an increase in the switching loss of the power MISFET. In this Embodiment 1, the formation depth of the p⁻ type semiconductor region 10 from about 1.5 $\mu$m to 2 $\mu$m can be given as one example, in a power MISFET having a breakdown voltage, between source and drain, of from about 150V to 600V. Formation of the p⁻ type semiconductor region 10 while satisfying such conditions can be attained by implanting B, as an impurity ion having a p type conductivity, into the n⁻ type single crystal silicon layer 1B at an energy of about 75 keV and an implantation amount of about 1×10¹³ ions/cm² and then heating the substrate at about 110° C. for about 30 minutes in an atmosphere of oxygen and nitrogen mixed at a ratio of about 1:99.

As is not illustrated in the diagram, however, after the formation of the gate line 21, source pad 22, interconnects 23, 24 and 25, and gate pad 26, a polyimide resin film is applied to the upper part of the substrate as a protecting film, followed by exposure and development to remove the polyimide resin film from the gate pad 26 and source pad 22, whereby an opening portion is formed.

After the surface of the substrate is protected with a tape or the like, the back surface of the n⁺ type single silicon substrate 1A is polished with the protected surface down. Then, conductive films, for example, Ti (titanium) film, Ni (nickel) film and Au (gold) film are deposited successively by sputtering over the back surface of the n⁺ type single crystal silicon substrate 1A to form their film stack. This film stack serves as an extraction electrode (drain electrode) of the drain (n⁺ type single crystal silicon substrate 1A and n⁻ type single crystal silicon layer 1B).

After the tape is peeled off and a bump electrode made of, for example, Au is formed over the opening portion made in the polyimide resin film, the substrate in the wafer form is diced along dividing regions (not illustrated) into each chip. Each chip is then mounted on a lead frame (package board) having external terminals and sealed (packaged) with a resin, whereby the semiconductor device of this Embodiment 1 is manufactured.

(Embodiment 2)

A semiconductor device according to Embodiment 2 has, similar to the semiconductor device according to Embodiment 1, an n channel type power MISFET. The manufacturing method of this semiconductor device of Embodiment 2 will be described in the order of steps with reference to FIGS. 19 to 22.

Figure 19:
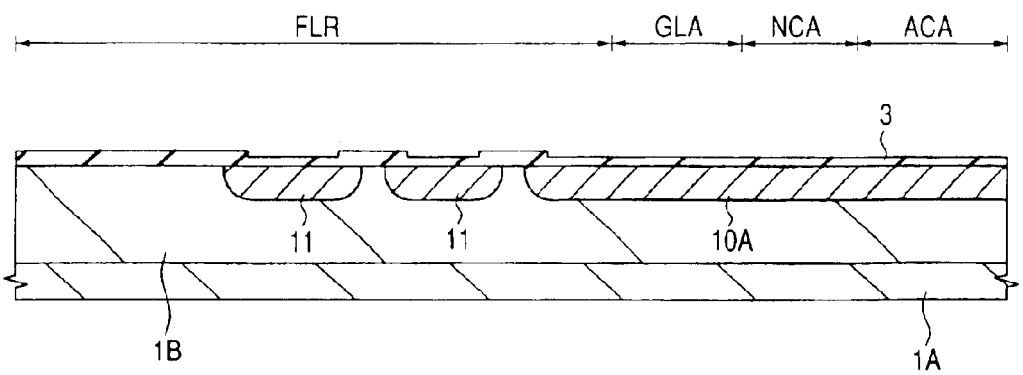
FIG. 19 is a fragmentary cross-sectional view for explaining the manufacturing method of a semiconductor device according to Embodiment 2 of the present invention.

The semiconductor device according to Embodiment 2 is fabricated in a similar manner to that of Embodiment 1 up to the steps as described using FIG. 1. Then, as illustrated in FIG. 19, with a photoresist film patterned by photolithography as a mask, a predetermined amount of the silicon oxide film 3 is etched to form a step difference in the silicon oxide film 3. This step difference can be used as a mark for alignment upon patterning of the photoresist film in the subsequent step. With this pattern as a mask, an impurity ion (for example, B) having a p type conductivity is implanted into the n– type single crystal silicon layer 1B. The substrate is then heat treated to diffuse the impurity ion, whereby a p⁻ type semiconductor region 10A and p– type field limiting ring 11 are formed.

Figure 20:
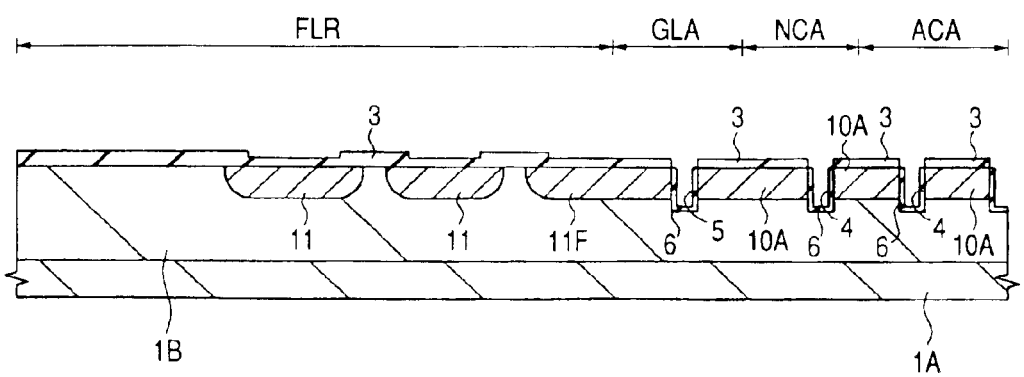
FIG. 20 is a fragmentary cross-sectional view of the semiconductor device during the manufacturing step following that of FIG. 19.

As illustrated in FIG. 20, with a photoresist film patterned by photolithography as a mask, the silicon oxide film 3 and n⁻ type single crystal silicon layer 1B (p⁻ type semiconductor region 10A) were etched to form a groove 4 in the active cell region ACA and nonactive cell region NCA and a groove 5 in the gate line area GLA. The grooves 4 and 5 are formed so that their depths become greater than those of the p⁻ type semiconductor region 10A and p⁻ type field limiting ring 11. Here, the p⁻ type semiconductor region 10A existing in the outer peripheral direction of the chip than the groove 5 is called p⁻ type field limiting ring 11F.

The substrate is then subjected to thermal oxidation treatment to form a silicon oxide film 6 over the side walls and bottom of each of the grooves 4 and 5. This silicon oxide film 6 becomes a gate insulating film of the power MISFET.

Figure 21:
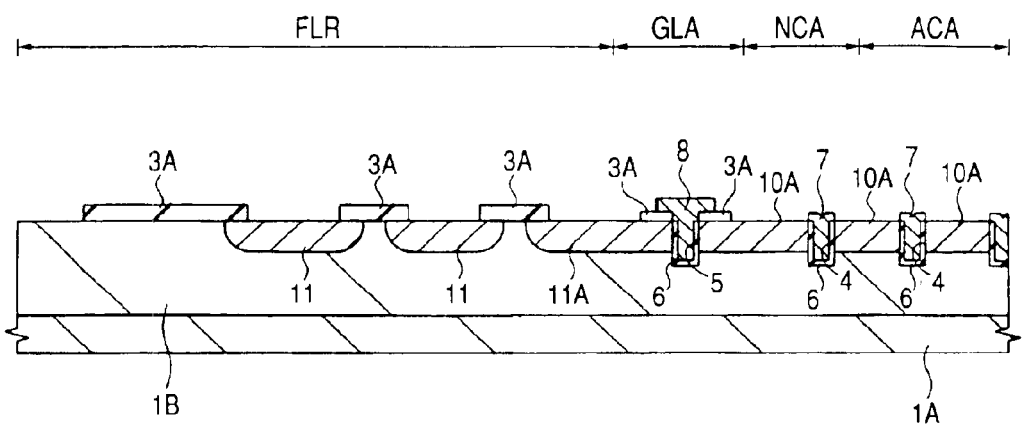
FIG. 21 is a fragmentary cross-sectional view of the semiconductor device during the manufacturing step following that of FIG. 20.

As illustrated in FIG. 21, a polycrystalline silicon film doped with P is then deposited over the silicon oxide film 3 including the insides of the grooves 4 and 5 to embed the grooves 4 and 5 with the polycrystalline silicon film. With a photoresist film patterned by photolithography as a mask, the polycrystalline silicon film is etched. By leaving the polycrystalline silicon film inside of the grooves 4 and 5, a gate electrode 7 of the power MISFET is formed in the groove 4, while a gate extraction electrode 8 is formed in the groove 5. Upon this formation, patterning is conducted to leave, outside the groove 5, a portion of the polycrystalline silicon film forming the gate extraction electrode 8. By this patterning, the gate extraction electrode 8 extends in a direction vertical to this paper in FIG. 21, and the width outside the groove 5 becomes greater than the width in the groove 5. With a photoresist film patterned by photolithography as a mask, the silicon oxide film 3 is etched to remove an unnecessary portion of the silicon oxide film 3. A field insulating film 3A is formed from the remaining silicon oxide film 3.

Figure 22:
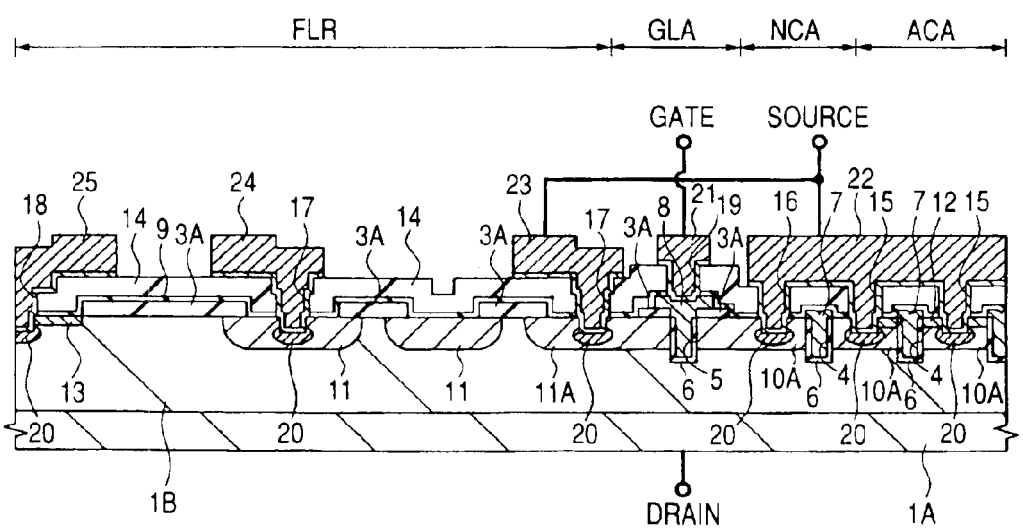
FIG. 22 is a fragmentary cross-sectional view of the semiconductor device during the manufacturing step following that of FIG. 21.

As illustrated in FIG. 22, by similar steps to those described referring to FIGS. 5 to 9 in Embodiment 1, the semiconductor device of Embodiment 2 is then manufactured.

According to Embodiment 2, an impurity ion for the formation of the p⁻ type semiconductor region 10A, and p⁻ type field limiting rings 11, 11A is implanted prior to the formation of the groove 5 in which the gate extraction electrode 8 is to be formed so that the impurity ion can be implanted into the whole surface of the gate line area GLA. This makes it possible to bring the p⁻ type semiconductor region 10A, and p⁻ type field limiting rings 11, 11A into definite contact with the side walls of the groove 5, resulting in prevention of lowering in breakdown voltage in the gate line area GLA.

Figure 23:
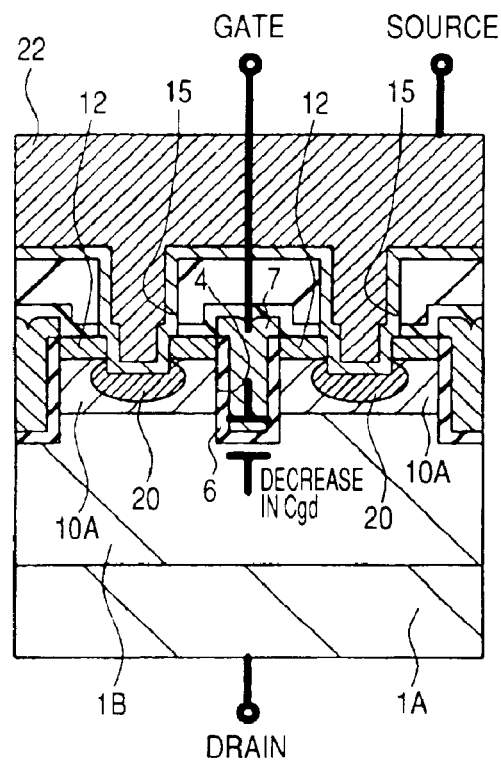
FIG. 23 is a fragmentary cross-sectional view of the semiconductor device according to Embodiment 2 of the present invention.
Figure 24:
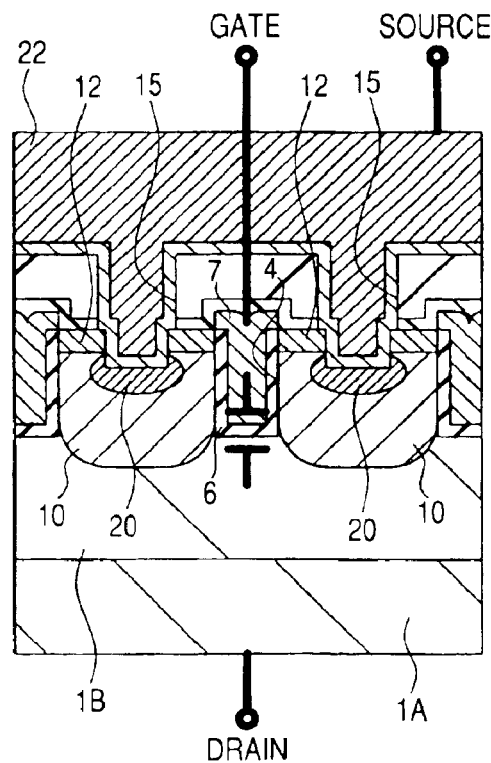
FIG. 24 is a fragmentary cross-sectional view of the semiconductor device according to Embodiment 1 compared with the semiconductor device according to Embodiment 2 of the present invention.

FIGS. 23 and 24 are enlarged views of the active cell region ACA of the substrate in Embodiment 2 and Embodiment 1, respectively.

According to the manufacturing steps of the semiconductor substrate of Embodiment 2, the formation of the groove 4 in which the gate electrode 7 is to be disposed follows the formation of the p⁻ type semiconductor region 10A so that the groove 4 must be formed with a greater depth than that of the p⁻ type semiconductor region 10A. According to the power MISFET of Embodiment 2 compared with that of Embodiment 1, a sufficient accumulation layer can be formed over the side surface of the groove 4 adjacent to the n⁻ type single crystal silicon layer 1B upon on action so that on resistance can be decreased. This enables a reduction in steady-state loss. On the other hand, in the power MISFET of the semiconductor device of Embodiment 2 compared with that of Embodiment 1, the formation depth of the groove 4 is greater than that of the p⁻ type semiconductor region 10A so that the silicon oxide film 6 formed over the side walls and bottom of the groove 4 is brought into contact with the n⁻ type single crystal silicon layer 1B at a greater area. In the power MISFET of the semiconductor device of Embodiment 2, therefore, the capacitance of the gate/drain having the silicon oxide film 6 as a capacitive insulating film is greater than that of the power MISFET of Embodiment 1, leading to a greater switching loss compared with that of the power MISFET of Embodiment 1. Based on the above-described comparison, it is preferred to use the manufacturing method of the semiconductor device of Embodiment 2 when priority is given to a reduction in steady-state loss of the power MISFET, and the manufacturing method of the semiconductor device of Embodiment 1 when priority is given to an improvement in the switching rate.

(Embodiment 3)

In Embodiment 3, another planar pattern is employed for the gate electrode 7 (refer to FIG. 12) in stead of square mesh in Embodiment 1.

Figure 25:
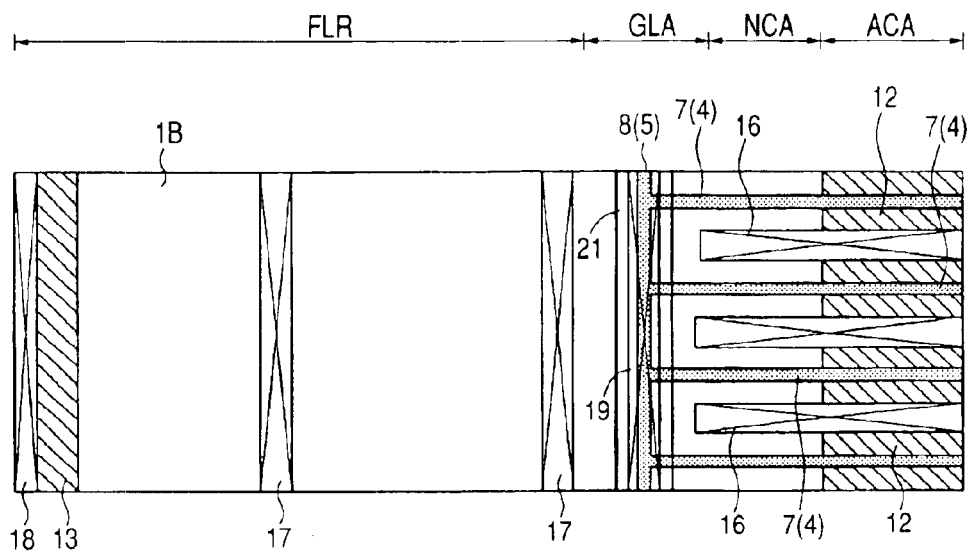
FIG. 25 is a fragmentary plan view of a semiconductor device according to Embodiment 3 of the present invention.

As illustrated in FIG. 25, in this Embodiment 3, a portion extending in the same direction with that of the gate extraction electrode 8 (groove 5) is omitted from the square mesh planar pattern of the gate electrode 7 (groove 4) of Embodiment 1. By this change, a contact area between the silicon oxide film 6 (refer to FIG. 9, for example), which is formed over the side walls and bottom of the groove 4 and serves as a gate insulating film of the power MISFET, and the n⁻ type single crystal silicon layer 1B becomes smaller than that of Embodiment 1, whereby in the power MISFET of the semiconductor device according to Embodiment 3, the capacitance between gate and drain having the silicon oxide film 6 as a capacitive insulating film becomes smaller than that in the power MISFET according to Embodiment 1. This leads to a reduction in switching loss compared with the power MISFET according to Embodiment 1. In short, a switching rate can be improved in the power MISFET according to Embodiment 3 compared with that in the power MISFET according to Embodiment 1.

(Embodiment 4)

In Embodiment 4, the planar pattern of the gate electrode 7 illustrated in FIG. 25 in Embodiment 3 is deformed.

Figure 26:
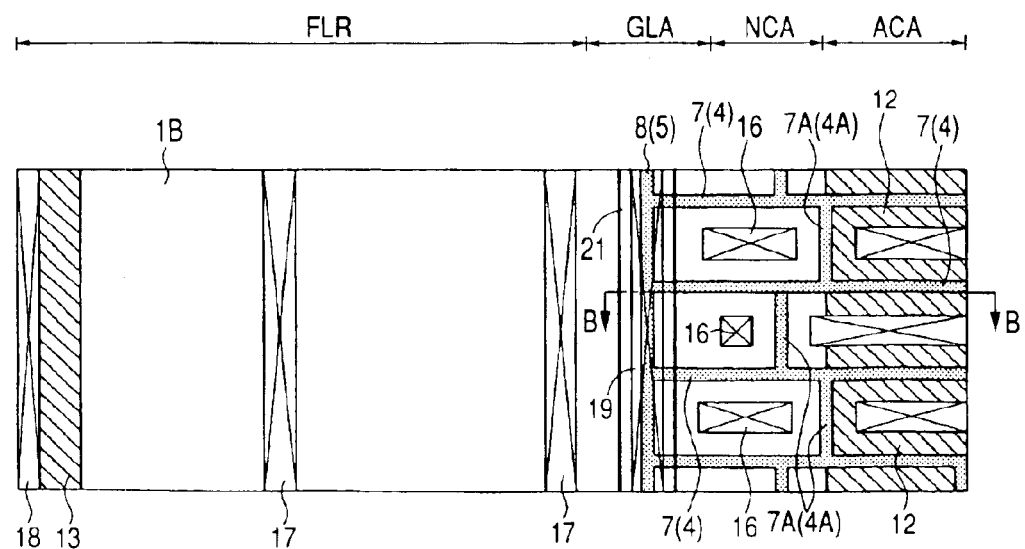
FIG. 26 is a fragmentary plan view of a semiconductor device according to Embodiment 4 of the present invention.
Figure 27:
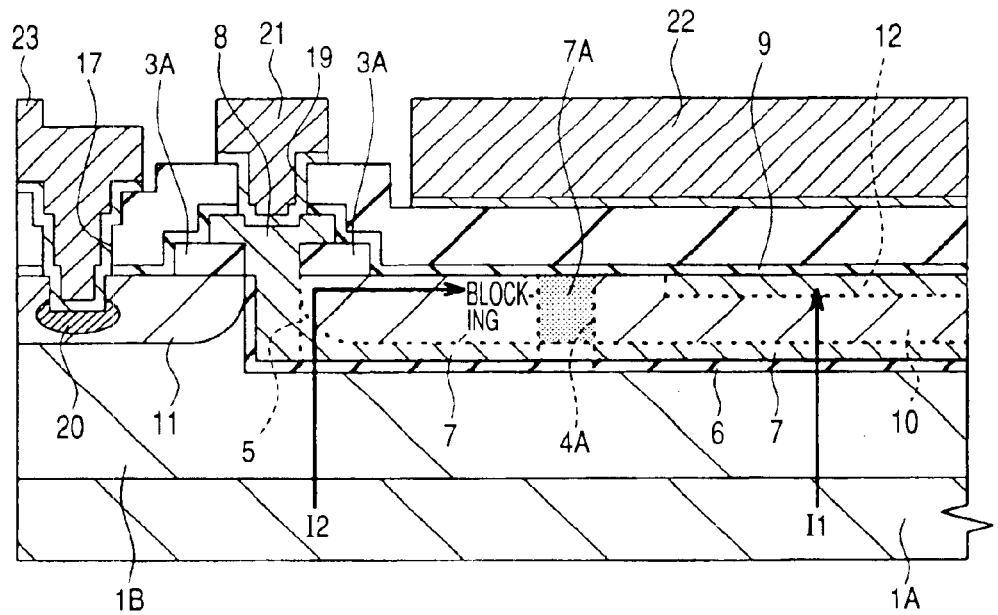
FIG. 27 is a cross-sectional view taken along a line B—B of FIG. 26.

In Embodiment 4, as illustrated in FIGS. 26 and 27, a gate electrode (first conductor, fourth portion) 7A (groove 4a) extending in the same direction with that of the gate extraction electrode 8 is added to the planar pattern of the gate electrode (third portion) 7 extending in a direction crossing the extending direction of the gate extraction electrode 8 as illustrated in Embodiment 3, by disposing it between the gate extraction electrode 8 (groove 5) and the n⁺ type semiconductor region 12 which is to be a source region of the power MISFET. FIG. 27 is a cross-sectional view taken along a line B—B of FIG. 26.

Figure 28:
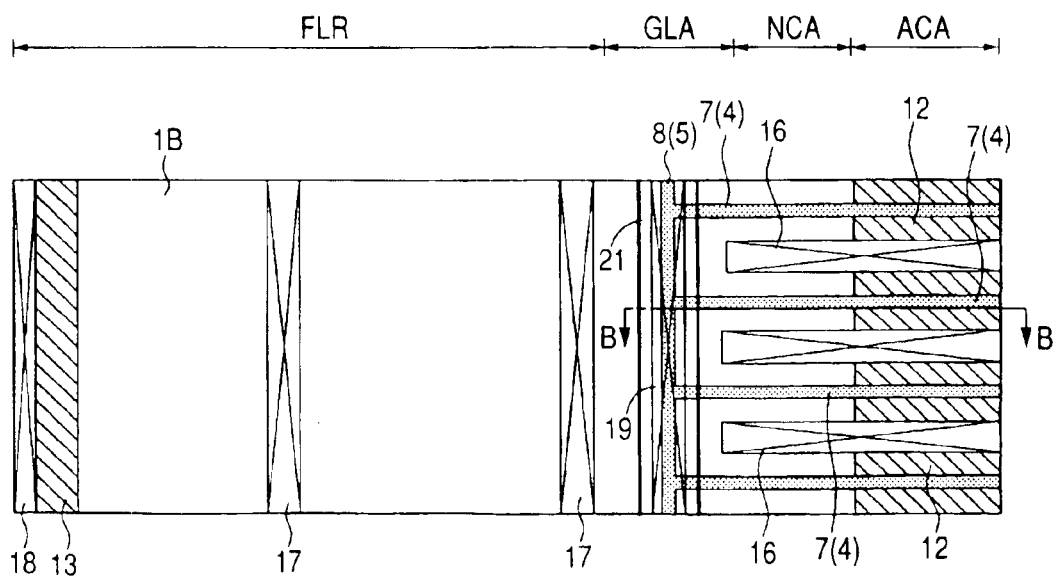
FIG. 28 is a fragmentary plan view of a semiconductor device used for comparison with the semiconductor device according to Embodiment 4 of the present invention.
Figure 29:
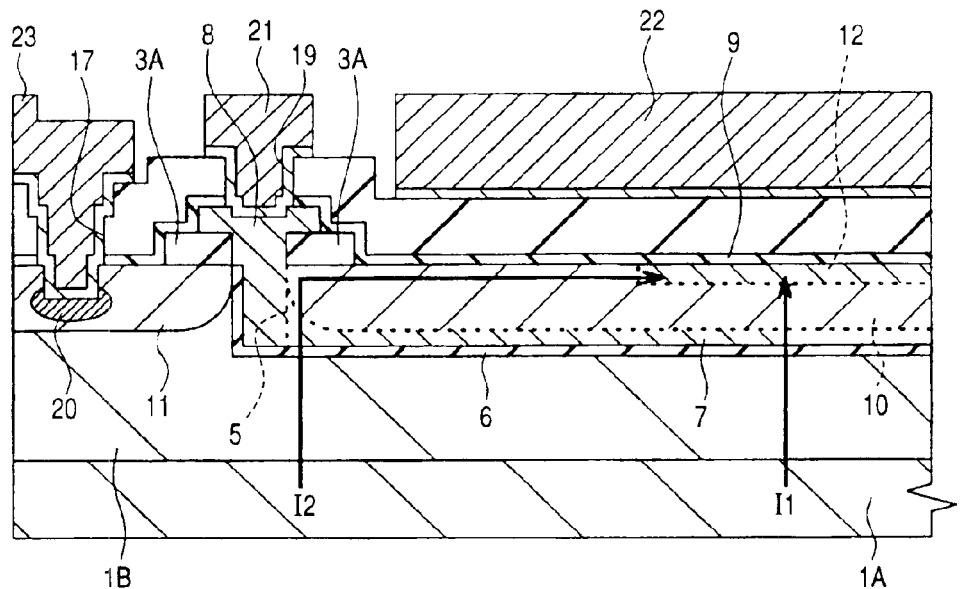
FIG. 29 is a cross-sectional view taken along a line B—B of FIG. 28.

The pattern of the gate electrode 7 formed as illustrated in Embodiment 3 will next be investigated based on FIGS. 28 and 29. FIG. 29 is a cross-sectional view taken along a line B—B of FIG. 28. As illustrated in FIGS. 28 and 29, when the gate electrode 7A (groove 4A) is not disposed between the gate extraction electrode 8 (groove 5) and the n⁺ type semiconductor region 12, operation of the power MISFET causes a current component I1 (current by the normal power MISFET) to flow in a vertical direction from the drain (n⁺ type single crystal silicon substrate 1A and n⁻ type single crystal silicon layer 1B) toward the source (n⁺ type semiconductor region 12) and in addition, a current component 12 by a parasitic MISFET to flow along the side walls of the groove 5 in which the gate extraction electrode 8 has been formed and the surface of the p⁻ type semiconductor region 10. Since this flow of the current component 12 concentrates on the terminal portion (nonactive cell region NCA) of the power MISFET cell, there is a potential danger of narrowing of the area of safe operation (ASO) of the power MISFET owing to local heat emission.

Figure 30:
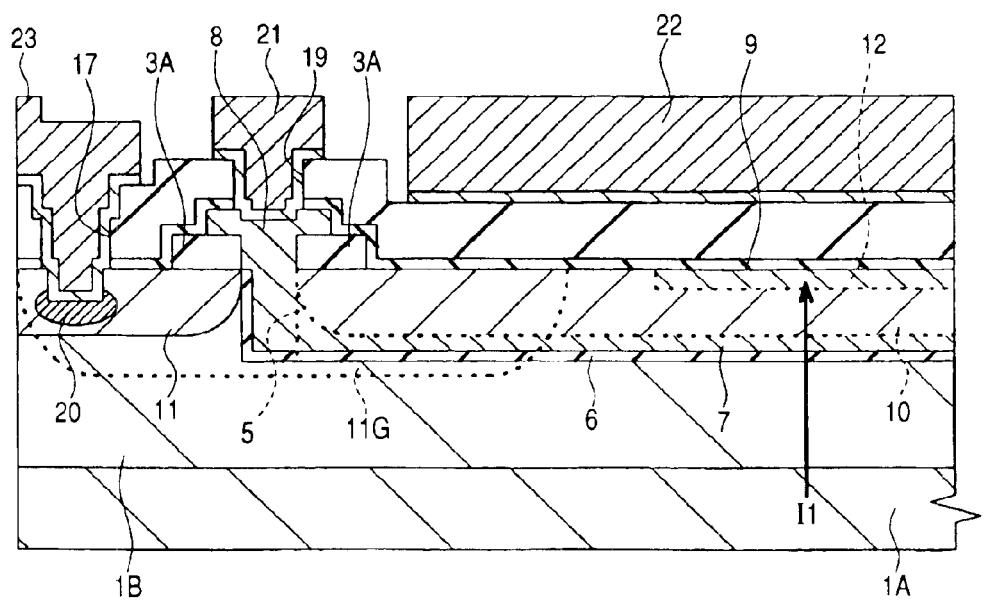
FIG. 30 is a fragmentary cross-sectional view of a semiconductor device used for comparison with the semiconductor device according to Embodiment 4 of the present invention.

As illustrated in FIG. 30, addition of a p well 11G, between the terminal portion of the cell of the power MISFET and the p⁻ type field limiting ring 11 electrically connected to the interconnect 23, which well partially overlaps with these p⁻ type field limiting ring 11 and p⁻ type semiconductor region 10 can be considered as one countermeasure. Owing to the overlapping between the p⁻ type semiconductor region 10 and the p well 11G, a region having an impurity implanted therein at a higher concentration than the single p⁻ type semiconductor region 10 is formed, making it possible to cause the threshold voltage of the parasitic MISFET to exceed the normal MISFET (power MISFET). As a result, the current component 12 due to parasitic MISFET can be blocked substantially. In other words, narrowing of the area of safe operation (ASO) of the power MISFET attributable to the local emission of heat, which will otherwise occur owing to the concentrated flow of the current component 12 due to the parasitic MISFET at the terminal portion of the cell of the power MISFET, can be prevented. The p well 11G partially overlapping with the p⁻ type field limiting ring 11 and p⁻ type semiconductor region 10 however cannot be formed simultaneously in the same step with that for the p⁻ type field limiting ring 11 and p⁻ type semiconductor region 10 so that the number of the manufacturing steps of the power MISFET increases and there is a fear of prolongation of the manufacturing period of the semiconductor device having a power MISFET.

According to this Embodiment 4 as illustrated in FIGS. 26 and 27, on the other hand, the current component 12 due to the parasitic MISFET can be blocked only by adding, to the planar pattern of the gate electrode 7, the gate electrode 7A which can be formed simultaneously with the gate electrode 7. Addition of the p well 11G as described above is not necessary. As a result, narrowing of the area of safe operation of the power MISFET can be prevented without increasing the number of the manufacturing steps of the semiconductor device according to Embodiment 4.

(Embodiment 5)

In Embodiment 5, the planar patterns of the contact groove 19 (refer to FIG. 12) and the gate line (refer to FIG. 12) in Embodiment 1 are changed.

Figure 31:
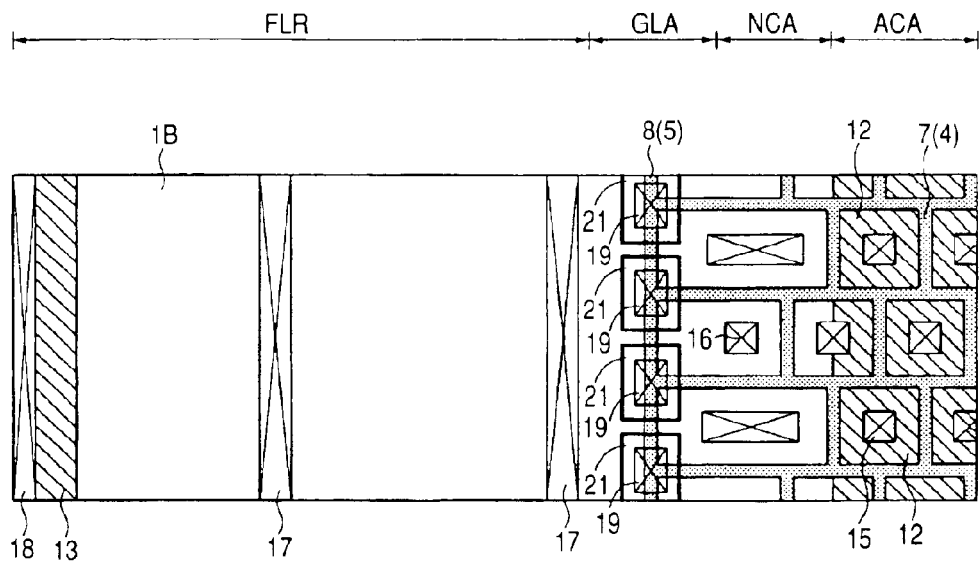
FIG. 31 is a fragmentary plan view of a semiconductor device according to Embodiment 5 of the present invention.

As illustrated in FIG. 31, in Embodiment 5, the contact groove 19 and gate line 21, which extend integrally as one line in Embodiment 1, are formed at connecting positions of the gate electrode 7 and gate extraction electrode 8, respectively. As a result of this deformation, when a breakdown voltage is applied to the drain, a depletion layer extending from the p⁻ type semiconductor region 10 (refer to FIG. 9, for example) and p⁻ type field limiting ring 11 (refer to FIG. 9, for example), each adjacent to the groove 5, are made to spread from four directions of the groove 5, when viewed from the top. This makes it possible to relax the electric field in the TBA (refer to FIG. 15), that is, area near the bottom of the groove 5 compared with that of Embodiment 1. According to Embodiment 5, the breakdown voltage in the gate line area GLA can be improved further compared with that of Embodiment 1.

(Embodiment 6)

Figure 32:
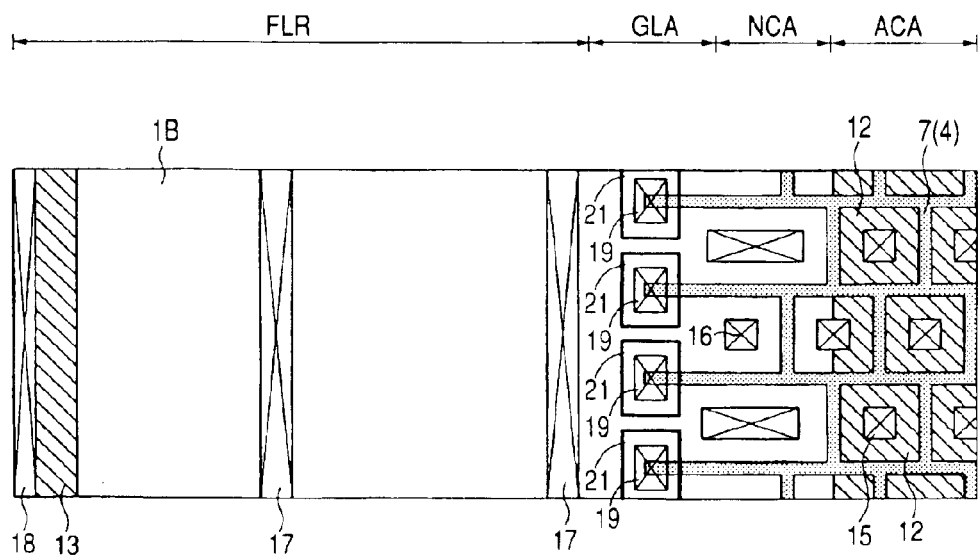
FIG. 32 is a fragmentary plan view of a semiconductor device according to Embodiment 6 of the present invention.

In this Embodiment 6, as illustrated in FIG. 32, the groove 5 and gate extraction electrode 8 are omitted from the planar pattern of Embodiment 5 and the groove 4 and gate electrode 7 are extended to the lower part of the contact groove 19. According to this Embodiment 6, when a breakdown voltage is applied to the drain, a depletion layer extending from the p⁻ type semiconductor region 10 (refer to FIG. 9, for example) and p⁻ type field limiting ring 11 (refer to FIG. 9, for example), each adjacent to the groove 4 of the gate line area GLA, is made to spread more effectively from the four directions of the groove 4 of the gate line area GLA when viewed from the top. In short, by this Embodiment 6, a further improvement in the breakdown voltage of the gate line area GLA can be attained compared with Embodiment 5.

(Embodiment 7)

Figure 33:
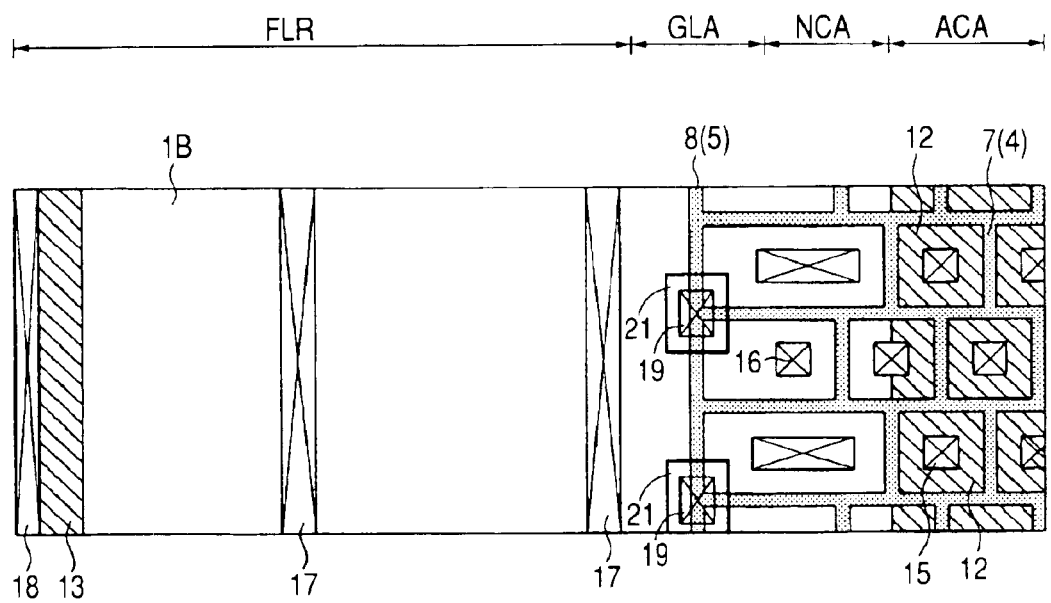
FIG. 33 is a fragmentary plan view of a semiconductor device according to Embodiment 7 of the present invention.

As illustrated in FIG. 33, Embodiment 7 has a similar planar pattern to that of Embodiment 5 except that from the plurality of contact grooves 19 and gate lines 21, any desired ones are omitted. According to this Embodiment 7 compared with Embodiment 5, when a breakdown voltage is applied to the drain, a depletion layer extending from the p⁻ type semiconductor region 10 (refer to FIG. 9, for example) and p⁻ type field limiting ring 11 (refer to FIG. 9, for example), each adjacent to the groove 5, is made to spread more effectively from the four directions of the groove 5 when viewed from the top. In short, by this Embodiment 7, a further improvement in the breakdown voltage of the gate line area GLA can be attained compared with Embodiment 5.

In Embodiment 6, the groove 5 and gate extraction electrode 8 are omitted so that a terminal portion of the gate electrode 7 is disposed in the gate line area GLA. There is therefore a fear of lowering of the breakdown voltage of the gate electrode 7. According to this Embodiment 7, however, the terminal portion of the gate electrode 7 is connected to the gate extraction electrode 8, making it possible to prevent a lowering in the breakdown voltage of the gate electrode 7.

The present invention completed by the present inventors was described specifically based on some embodiments of the present invention. It should however be borne in mind that the present invention is not limited to or by them. It is needless to say that it can be modified within an extent not departing from the scope of the invention.

For example, the planar pattern of the gate electrode is square mesh in Embodiment 1, but hexagonal or octagonal mesh structure may be employed, alternatively.

In Embodiment 1, described was the case where two p⁻ type field limiting rings are used for the floating potential, but the number of these rings may be changed, depending on the breakdown voltage required for the power MISFET.

The advantage available by the typical inventions, of the inventions disclosed by the present invention, will be described as follows.

Heightening of a breakdown voltage of a power MISFET can be attained without increasing the number of manufacturing steps of a semiconductor device.

What is claimed is:

1. A semiconductor device comprising:
    a semiconductor substrate having a main surface and a back surface, including a first region, a second region and a third region, and having a first semiconductor layer of a first conductivity type formed over the main surface;
    a second semiconductor layer of a second conductivity type opposite to the first conductivity type formed over the first semiconductor layer in the first region;

a plurality of first groove portions penetrating, in the first region, through the second semiconductor layer from the main surface of the semiconductor substrate;

a first insulating film formed in the first groove portions;

a first conductor formed over the first insulating film;

a third semiconductor layer formed, in the second semiconductor layer, adjacent to the first groove portions and having the first conductivity type;

a second groove portion formed in the second region;

a second insulating film formed in the second groove portion;

a second conductor formed over the second insulating film and electrically connected to the first conductor; and a plurality of fourth semiconductor layers of second conductivity type formed over the first semiconductor layer in the third region, wherein the second groove portion is adjacent to the second semiconductor layer and the fourth semiconductor layer, and wherein the second semiconductor layer and the fourth semiconductor layer each has a first impurity concentration and a first depth.

2. A semiconductor device according to claim 1, including an MISFET having the first semiconductor layer as a drain, the second semiconductor layer as a channel, the third semiconductor layer as a source and the first conductor layer as a gate.

3. A semiconductor device according to claim 2, wherein the first semiconductor layer, the third semiconductor layer and first conductor are electrically connected to drain electrode, source electrode and gate electrode, respectively, and wherein the second semiconductor layer and the third semiconductor layer are electrically connected via the source electrode.

4. A semiconductor device according to claim 3, wherein the plurality of fourth semiconductor layers are field limiting rings encompassing the first region and second region when viewed from the top.

5. A semiconductor device according to claim 3, wherein the plurality of fourth semiconductor layers prevent lowering in the breakdown voltage between the source electrode and drain electrode.

6. A semiconductor device according to claim 3, wherein when a reverse bias is applied to the drain and channel, depletion layers extending from the second semiconductor layer and fourth semiconductor layer are connected with each other.

7. A semiconductor device according to claim 3, wherein the fourth semiconductor layer is electrically connected with the third conductor in the third region.

8. A semiconductor device according to claim 3, wherein when reverse bias is applied to the drain and channel, the breakdown voltage in the second region is equal to or higher than a breakdown voltage lower of the breakdown voltage in the first region and the breakdown voltage in the third region.

9. A semiconductor device according to claim 3, wherein the breakdown voltage between the source electrode and drain electrode is 100V or greater.

10. A semiconductor device according to claim 3, wherein the second conductor in the second region extends in a first direction which is parallel to the main surface of the semiconductor substrate, wherein the second conductor has a first portion extending in a direction vertical to the main surface of the semiconductor substrate and a second portion extending in a second direction which is parallel to the main surface of the semiconductor substrate and at the same time crosses the first direction, and wherein the width of the second portion parallel to the second direction is not greater than $3.80+0.148\, \rho$ ($\mu$m) in which the resistivity of the first semiconductor layer is represented by $\rho$ ($\Omega\cdot$cm).

11. A semiconductor device according to claim 3, wherein the second conductor in the second region extends in a first direction which is parallel to the main surface of the semiconductor substrate, wherein the second conductor has a first portion extending in a direction vertical to the main surface of the semiconductor substrate and a second portion extending in a second direction which is parallel to the main surface of the semiconductor substrate and crosses the first direction;

wherein a third insulating film is formed between the second portion and the main surface of the semiconductor substrate, and wherein the width of the third insulating film parallel to the second direction is not greater than $3.80+0.148\, \rho$ ($\mu$m) wherein the resistivity of the first semiconductor layer is represented by $\rho$ ($\Omega\cdot$cm).

12. A semiconductor device according to claim 3, wherein a plurality of the first conductors extend in a second direction which is parallel to the main surface of the semiconductor substrate.

13. A semiconductor device according to claim 12, wherein the first conductor also exists in a first direction which is parallel to the main surface of the semiconductor substrate and crosses the second direction.

14. A semiconductor device according to claim 3, wherein the first conductor has a third portion extending in a direction which is parallel to the main surface of the semiconductor substrate and extends in a direction crossing an extending direction of the second conductor, and a fourth portion extending in a direction which is parallel to the main surface of the semiconductor substrate and in an extending direction of the second conductor, and wherein the fourth portion is disposed between the second conductor and the third semiconductor layer.

15. A semiconductor device comprising:

a semiconductor substrate having a main surface and a back surface, including a first region, a second region and a third region, and having a first semiconductor layer of a first conductivity type formed over the main surface;

a second semiconductor layer formed over the first semiconductor layer in the first region and having a second conductivity type opposite to the first conductivity type;

a plurality of first groove portions penetrating, in the first region, through the second semiconductor layer from the main surface of the semiconductor substrate;

a first insulating film formed in the first groove portions;

a first conductor formed over the first insulating film;

a third semiconductor layer formed, in the second semiconductor layer, adjacent to the first groove portion and having the first conductivity type;

a second groove portion formed in the second region;

a second insulating film formed in the second groove portion;

a second conductor formed over the second insulating film and electrically connected to the first conductor;

a plurality of fourth semiconductor layers of second conductivity type formed over the first semiconductor layer in the third region; and in the first region, a trench gate type MISFET having the first semiconductor layer as a drain, the second semiconductor layer as a channel, the third semiconductor layer as a source and the first conductor as a gate, the semiconductor device further comprising:

a gate extraction portion comprised of the second conductor and field limiting rings comprised of the plurality of fourth semiconductor layers and encompass the first region and the second are when viewed from the top, wherein the second semiconductor layer and the plurality of the fourth semiconductor layers are formed in one step.

16. A manufacturing method of a semiconductor device having a trench gate type MISFET, a gate extraction portion for the trench gate type MISFET and a field limiting ring in a first region, a second region and a third region of a semiconductor substrate, respectively, comprising the steps of:

(a) forming a first semiconductor layer of a first conductivity type over the main surface of the semiconductor substrate;

(b) forming a first groove portion and a second groove portion in the first region and the second region, respectively, over the main surface of the semiconductor substrate;

(c) forming an insulating film in the first groove portion and the second groove portion;

(d) forming a conductor over the insulating film;

(e) after the step (d), implanting an impurity of a second conductivity type opposite to the first conductivity type into the semiconductor substrate in the first region to form a second semiconductor layer of the second conductivity type over the first semiconductor layer in the first region, and implanting an impurity of the second conductivity type opposite to the first conductivity type into the semiconductor substrate in the third region to form a fourth semiconductor layer of the second conductivity type over the first semiconductor layer in the third region; and (f) implanting an impurity of the first conductivity type into the second semiconductor layer to form therein a third semiconductor layer of the first conductivity type adjacent to the first groove portion, wherein the second semiconductor layer is formed so that the first groove portion penetrates through the second semiconductor layer, wherein in the first region, the trench gate type MISFET having the first semiconductor layer as a drain, the second semiconductor layer as a channel, the third conductor layer as a source and the conductor in the first region as a gate, and wherein the field limiting ring is formed to encompass the first region and the second region from the fourth semiconductor layer, when viewed from the top.

17. A manufacturing method of a semiconductor device according to claim 16, wherein the conductor in the second region has a first width in the second groove portion and a second width outside the second groove portion and the conductor is formed so that the second width exceeds the first width.

18. A manufacturing method of a semiconductor device according to claim 16, wherein the second semiconductor layer and the fourth semiconductor layer are formed in one step.

19. A manufacturing method of a semiconductor device having a trench gate type MISFET, gate extraction portion for the trench gate type MISFET and field limiting ring in first, second, and third regions of the semiconductor substrate, respectively, comprising the steps of:

(a) forming a first semiconductor layer of a first conductivity type over the main surface of the semiconductor substrate;

(b) implanting an impurity having a second conductivity type opposite to the first conductivity type into the semiconductor substrate in the first region to form a second semiconductor layer of the second conductivity type over the first semiconductor layer in the first region, and implanting an impurity of the second conductivity type opposite to the first conductivity type in the semiconductor substrate in the third region to form a fourth semiconductor layer of the second conductivity type over the first semiconductor layer in the third region;

(c) after the step (b), forming a first groove portion and a second groove portion in the first region and the second region, respectively, over the surface of the semiconductor substrate;

(d) forming an insulating film in the first groove portion and the second groove portion;

(e) forming a conductor over the insulating film; and (f) implanting an impurity of the first conductivity type into the second semiconductor layer and thereby forming therein a third semiconductor layer of the first conductivity type which is adjacent to the first groove portion, wherein the first groove portion is formed to penetrate through the second semiconductor layer, wherein in the first region, the trench gate type MISFET having the first semiconductor layer as a drain, the second semiconductor layer as a channel, the third semiconductor layer as a source, and the conductor in the first region as a gate is formed, and wherein the field limiting ring encompassing the first region and the second region is formed from the fourth semiconductor layer when viewed from the top.

20. A manufacturing method of a semiconductor device according to claim 19, wherein the second semiconductor layer and the fourth semiconductor layer are formed in one step.

* * * * *